US006853939B2

(12) United States Patent
Coffeen

(10) Patent No.: US 6,853,939 B2
(45) Date of Patent: Feb. 8, 2005

(54) SYSTEMS AND METHODS FOR MULTIPLE WINDING IMPULSE FREQUENCY RESPONSE ANALYSIS TEST

(75) Inventor: Larry T. Coffeen, Jackson, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 115 days.

(21) Appl. No.: 10/342,523

(22) Filed: Jan. 15, 2003

(65) Prior Publication Data

US 2003/0139891 A1 Jul. 24, 2003

Related U.S. Application Data

(60) Provisional application No. 60/349,535, filed on Jan. 18, 2002.

(51) Int. Cl.[7] .................................................. G06F 3/05
(52) U.S. Cl. ........................ 702/108; 702/109; 702/112; 702/115; 702/183
(58) Field of Search ............................... 702/109, 112, 702/115–118, 182, 183, 57, 60, 64, 104, 108, 110; 166/302; 585/1; 700/285; 250/574; 361/160; 363/16

(56) References Cited

U.S. PATENT DOCUMENTS

| | | | | |
|---|---|---|---|---|
| 4,654,806 A | | 3/1987 | Poyser et al. ................ 364/551 |
| 4,761,703 A | | 8/1988 | Kliman et al. ................ 361/23 |
| 4,857,856 A | | 8/1989 | Coleman et al. ............. 324/547 |
| 4,888,541 A | | 12/1989 | Russell ........................ 318/696 |
| 4,996,637 A | * | 2/1991 | Piechnick .................... 363/16 |
| 5,087,885 A | | 2/1992 | Bergstrom .................. 324/547 |
| 5,455,506 A | | 10/1995 | Mimeault et al. ............. 324/547 |
| 6,041,287 A | | 3/2000 | Dister et al. ................. 702/182 |
| 6,208,497 B1 | * | 3/2001 | Seale et al. .................. 361/160 |
| 6,377,148 B1 | | 4/2002 | Forbes et al. ................ 335/301 |
| 6,434,512 B1 | | 8/2002 | Discenzo ..................... 702/184 |
| 6,640,196 B1 | * | 10/2003 | Unsworth et al. ........... 702/115 |

OTHER PUBLICATIONS

Working Copy of Proceedings, International Symposium on Digital Techniques in High–Voltage Measurements, Toronto, Canada, Oct. 28–30, 1991, CIGRE Study Committee 33, WG 03, IEEE Power Engineering Society, Power Systems Instrumentation and Measurements Committee.

Example of State–Of–The–Art Public Doman, Feb. 22, 2000, Substation Equipment Diag. Conference VIII, Comparison of Two FRA Methods to Detect Transformer Winding Movement, R.J. Denis, S.K. An, Bonneville Power Administration, Vancouver, Washington, J. Vandermaar, M. Wang, Powertech Labs, Vancouver, British Columbia.

* cited by examiner

Primary Examiner—Patrick Assouad
Assistant Examiner—Felix Suarez
(74) Attorney, Agent, or Firm—Thomas, Kayden, Horstemeyer & Risley, L.L.P.

(57) ABSTRACT

The winding testing unit provides systems and methods for determining normal and/or abnormal characteristic signatures of same-voltage windings residing in a device, such as transformer, without the need for a comparison to past historical data. A plurality of characteristic signatures [H(f)'s] are determined for each of a plurality of windings. A plurality of differential characteristic signatures [H(f)'s] are then determined from a plurality of H(f) pairs selected from the plurality of H(f)'s. The differential H(f)'s are compared and at least one significant asymmetry is identified between the differential H(f)'s.

29 Claims, 7 Drawing Sheets

SYSTEMS AND METHODS FOR MULTIPLE WINDING IMPULSE FREQUENCY RESPONSE ANALYSIS TEST

CLAIM OF PRIORITY

This document claims priority to and the benefit of the filing date of and commonly assigned provisional application entitled "OBJECTIVE WINDING ASYMMETRY TEST FOR THE THREE PHASES OF POWER TRANSFORMER WINDINGS," assigned Ser. No. 60/349,535, filed Jan. 18, 2002, now abandoned, which is hereby incorporated herein by reference.

TECHNICAL FIELD

The present invention relates generally to energy delivery systems, and more particularly, to systems and methods for testing winding and winding connection displacements in a transformer.

BACKGROUND OF THE INVENTION

Electric utilities and other organizations are responsible for supplying an economic, reliable and safe source of electricity. Three major components are employed in an energy delivery system to provide the electricity to the end user, the generator, the transmission line and the transformer.

The transformer is a device that changes voltage or a power angle. Generally, voltage from the generator is a lower voltage than used by the transmission lines that transmit the electricity to the end user. Furthermore, the voltage used by the end user is much lower than voltage used by the transmission lines. Thus, one exemplary purpose of the transformer is to couple elements of an energy delivery system that operate at different voltages.

Transformers come in many different sizes, shapes and constructions. Typically, transformer rating corresponds to the capacity of the transformer. The rating is typically specified as the product of the maximum voltage and current, as measured from one side of the transformer, that the transformer is capable of converting at a particular operating condition. Such operating conditions include temperature and/or altitude. For example, a 500/230 kV transformer may be rated at 300 MVA (3,000 kilo-volt-amps) when operating at sea level and at 65° Celsius rise above ambient. Transformers may be constructed as separately insulated winding transformers or as auto transformers (where the low voltage winding is a portion of the overall or high voltage winding). Both designs occur as single phase or multiple phase transformers. The operating voltages, ratings and winding types of transformers employed in the industry, well known to one skilled in the art, are too numerous to describe in detail here other than to the extent necessary to understand the present deficiencies in the prior art.

All transformers, independent of size, rating and operating voltage, have several common characteristics. First, the transformer is constructed from one or more windings, each winding having a plurality of individual coils arranged and connected in an end-to-end fashion. In some transformers, the winding is made by wrapping a wire around a laminated solid member, called a core. Alternatively, there may be no core. However, in all transformers, the individual winding turns must be electrically isolated from each other. An insulation material is wrapped around the wires such that when the plurality of coils are made, the metal wires of each winding are physically and electrically separated, or insulated, from each other. Insulation materials wrapped around the windings may vary. Paper, impregnated with oil, is often used. Other types of transformers may use only paper, or may use another suitable material such as a "polymeric compound."

Maintaining the electrical insulation within and/or between the windings is absolutely essential for the proper operation of a transformer. In the event that the electrical insulation is breached, such that electricity passes from one winding coil across the breach to another winding coil, special protective devices will operate to disconnect the transformer from the electrical system. The devices, by removing electricity applied to the transformer, interrupt the undesirable current flow through the insulation breach to minimize damage to the transformer. This condition is commonly referred to in the industry as a "transformer fault."

Transformer faults are undesirable for at least two major reasons. First, end users may become separated from the energy delivery system, thereby loosing their electrical service. Second, transformer faults may result in large magnitudes of current flow, known as fault current, across the breach and through the transformer windings. Also, faults occurring on the energy delivery system at locations relatively close to the transformer may result in large fault currents flowing through the transformer. Often, fault current may be orders of magnitude greater than the highest level of normal operating current that the transformer was designed to carry. Such fault currents may cause severe physical damage to the transformer. For example, a fault current may physically bend portions of the transformer winding (winding deformation) and/or move the windings out of their original position in the transformer (winding displacement). Such winding deformation and/or displacement can cause over-voltage stresses on portions of the winding insulation and exacerbate the process of the naturally occurring deterioration of the winding insulation that occurs over a period of time. The fault current may further increase damage to the insulation, or damage insulation of adjacent windings, thereby increasing the magnitude and severity of the fault. In the most extreme cases, the fault current may cause an ignition in the transformer oil, resulting in a breach of the transformer casing and a subsequent fire or explosion.

Therefore, it is desirable to ensure the integrity of the transformer winding insulation. Once a transformer fault occurs, it is usually too late to minimize transformer damage and to reduce the period of electrical outage. The electric utility industry takes a variety of precautionary steps to ensure the integrity of winding insulation in transformers. One important precautionary step includes periodic testing of the transformer. Various tests are used to predict a probability of a future fault. One test commonly employed in the industry to detect winding deformation and/or displacement is the low voltage impulse test.

Prior art low voltage impulse tests present many unique problems. One significant problem is that a precise, repeatable input testing signal or pulse of known energy content to be sufficient for the test must be applied to the input terminal of the tested transformer winding when prior art frequency response analysis techniques are used to measure the frequency response of the transformer winding. If the applied input test signals/pulses are not identical to each other, the resultant characteristic signature of the tested transformer windings will not be accurate. For example, the prior art has no objective test accuracy or bandwidth limit analysis, so an unknown pulse at the input will compromise the test result without detection. In addition, the time delay between pulse applications for the prior art should be constant to prevent random distortion of the input pulse which affects the characteristic signature. For example, if the pulse intervals are not constant, the energy storage remaining in the transformer winding configuration will be different between pulses, thus altering the load impedance of the transformer and therefore, changing the parameters (frequency energy content) of the applied pulse. Furthermore, test signal/pulse generators or test pulse generators capable of providing such exact and repetitive input signals or pulses are expensive.

One technique of testing for an off-line, or de-energized, transformer winding deformation compares the characteristic signature [H(f)] for a winding over time. Changes in H(f) indicate winding deformation and/or displacement. H(f) is determined using a unique computational method fully described in the U.S. utility patent to Coffeen entitled, "SYSTEM AND METHOD FOR OFF-LINE IMPULSE FREQUENCY RESPONSE ANALYSIS TEST," having U.S. Pat. No. 6,369,582, filed on May 3, 2001, and issued to patent on Apr. 9, 2002, which is incorporated herein by reference in its entirety.

To derive H(f) for a winding under the U.S. Pat. No. 6,369,582 patent to Coffeen, a suitable number of input pulses or signals, provided by a pulse or signal generator, are applied to the winding. When this test is performed on a transformer, the transformer is offline. That is, the transformer has been disconnected from the electric system and is in a fully discharged, de-energized state.

After the test pulses or signals are applied to the winding, the auto-spectral density (Gxx) is calculated. Gxx is defined by the complex conjugate of the fast Fourier transform (FFT) of the input pulse or signal times the FFT of the same impulse or signal. The cross-spectral density (Gxy) is also calculated. Gxy is defined by the complex conjugate of the FFT of the input pulse times the FFT of the output pulse. The characteristic signature [H(f)] for the winding equals the average of the Gxy's divided by the average of the Gxx's for the respective pairs of input and output pulses or signals. Preferably, input pulses or signals are slightly different, or even very different, from each other.

Once H(f) is determined for the winding, the determined H(f) is compared with another earlier determined H(f) for that winding. Winding deformation and/or displacement can be determined by comparing the most recent H(f) with an earlier determined H(f).

Another technique of testing for transformer winding deformation also compares the characteristic signature [H(f)] for a winding over time. Here, the transformer is on on-line, or energized. The characteristic signature H(f) is determined using a unique computational method fully described in the U.S. utility patent to Coffeen entitled, "SYSTEM AND METHOD FOR ON-LINE IMPULSE FREQUENCY RESPONSE ANALYSIS TEST," having U.S. application Ser. No. 09/848,921, filed on May 3, 2001, which is incorporated herein by reference in its entirety.

To derive H(f) for a winding under the Ser. No. 09/848, 921 patent application to Coffeen, input pulses or signals that result from events out on the electric system propagate through the winding. Accordingly, the transformer is on-line. That is, the transformer remains connected to the electric system and is in a fully energized state.

Incoming voltage pulses due to abrupt changes in current or voltage originating elsewhere on the energy delivery system are detected. An output pulse is detected after the input pulse has propagated through the monitored winding. Spectral densities are determined from these detected input and output pulses. However, the electrical characteristics of these pulses, such as the current, voltage, frequency, wave shape and/or energy are unpredictable and vary randomly from pulse to pulse. Not all pulses will have sufficient energy to generate useable information that can be used to calculate spectral densities for all the frequencies of interest. Some pulses may have sufficient energy so that the spectral densities for all of the frequencies of interest are calculated. Other pulses will have sufficient energy in some frequencies so that spectral densities for some portions of the frequencies of interest are calculated. Accordingly, the on-line winding test unit monitors a winding and records the input and output pulses. Logic is executed that analyzes the input and output pulses by way of spectral densities to identify useable H(f) data, which is further processed to build a characteristic signature H(f) from the pieces of usable data. When a sufficient record of useable H(f) data portions are accumulated, a complete characteristic signature, H(f), for the monitored winding is constructed. Winding deformation and/or displacement can be determined by comparing the most recent computed H(f) with an earlier determined H(f).

However, the above-described systems that detect transformer winding deformation and/or displacement requires historical H(f) information that is compared to the currently determined H(f) information. Therefore, it is desirable to have a valid and reliable testing system and method that does not require historical H(f) information.

SUMMARY OF THE INVENTION

The winding testing unit provides systems and methods for determining normal and/or abnormal characteristic signatures of same-voltage windings residing in a device, such as transformer, without the need for a comparison to past historical data. Briefly described, in architecture, one embodiment among others includes an input signal sensor configured to detect a plurality of input signals entering a plurality of corresponding windings; an output signal sensor configured to detect a plurality of output signals, each one of the output signals corresponding to one of the input signals after the corresponding input signal has propagated through one of the plurality of windings; and a processor communicatively coupled to the signal generator and to the sensor, the processor programmed to compute a plurality of unique characteristic signatures [H(f)'s] from one of the plurality of input signals and the corresponding output signal, configured to compute a unique plurality of differential H(f)'s from a plurality of H(f) pairs selected from the plurality of H(f)'s, and further configured to compare the plurality of differential H(f)'s to identify asymmetries.

Another embodiment can be conceptualized as a method. The method can be summarized by the following steps: determining a plurality of characteristic signatures [H(f)'s] for each of a plurality of windings, determining a plurality of differential characteristic signatures [H(f)'s] from a plurality of H(f) pairs selected from the plurality of H(f)'s, comparing the differential H(f)'s and identifying at least one significant asymmetry between the differential H(f)'s.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The winding test systems and methods, as defined in the claims, can be better understood with reference to the following drawings. The components within the drawings are not necessarily to scale relative to each other, emphasis instead being placed on clearly illustrating the principles of the winding test system and method.

Figure 1:
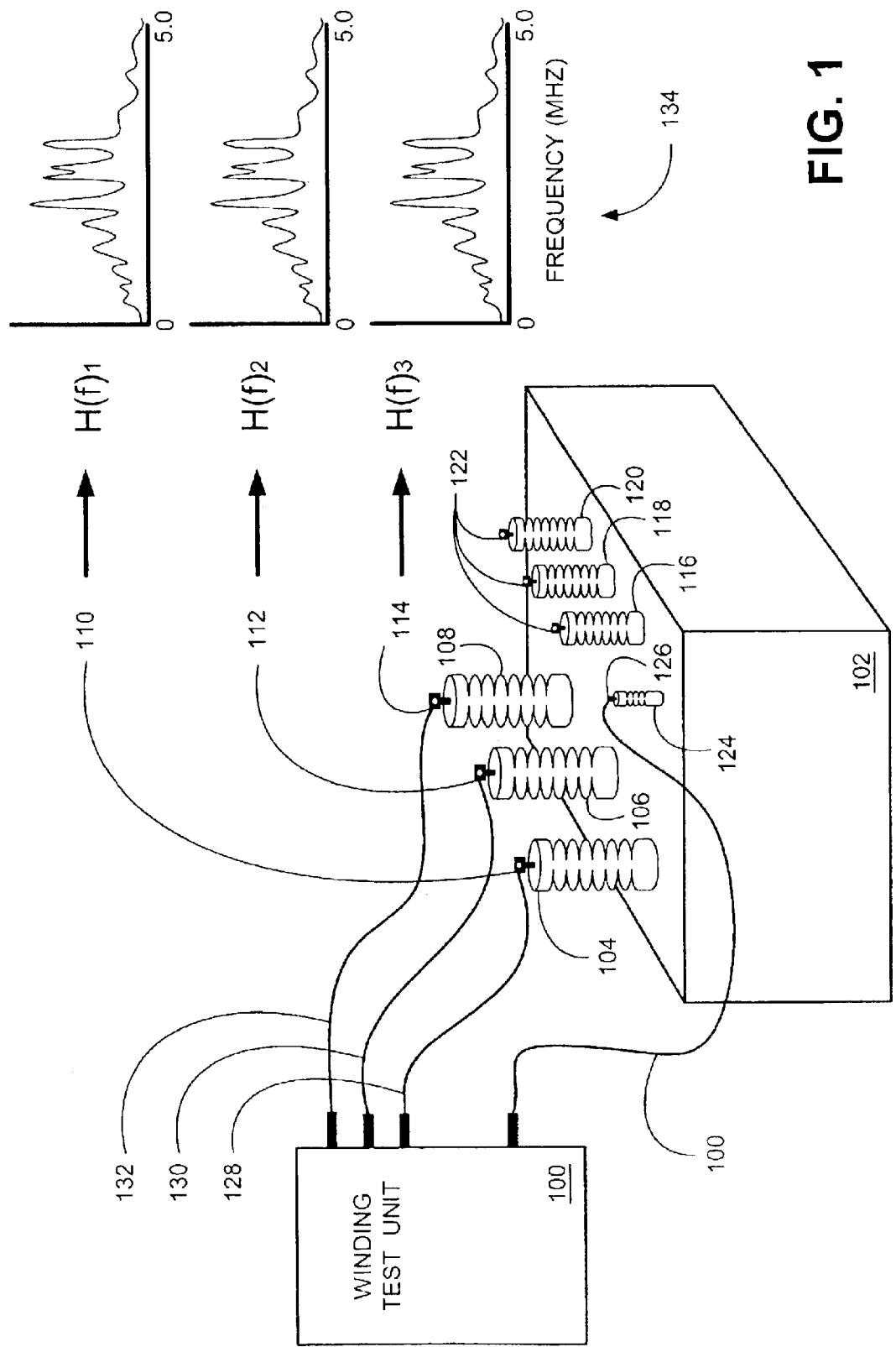
FIG. 1 is a simplified conceptual diagram of an embodiment of a winding test unit coupled to a transformer.

For convenience of illustration, elements among the several figures that are similar to each other may bear the same reference numerals. Such elements bearing the same reference numerals may be considered to be like elements; however, since these like numeraled elements are incidental to the operation of the present invention which utilizes existing portions of a communication network, one skilled in the art will realize that like numeraled elements among the several figures need not be identical, as any variations of such elements will not adversely affect the functioning and performance of the present invention. Furthermore, like elements that are like-numbered may be described in detail only in the first instance of occurrence, and not described in detail again when occurring in Subsequent figures.

DETAILED DESCRIPTION OF THE INVENTION

A. Overview of the Transformer Testing System and Method

FIG. 1 is a simplified conceptual diagram of an embodiment of a winding test unit 100 coupled to a transformer 102. Winding test unit 100 provides for determining normal and/or abnormal characteristic signatures of same-voltage windings residing in a device, such as transformer 102, without the need for a comparison to past historical data, and, in one embodiment, without the need for subjective expert opinions, by identifying significant asymmetries in differential characteristic signatures [H(f)'s]. Differential H(f)'s are, in one embodiment, determined by computing the difference between pairs of H(f)'s determined for a plurality of transformer windings.

Transformer 102 is a well known voltage conversion device employed in energy delivery systems. Transformer 102 is illustrated for convenience as a three phase transformer unit as having three high voltage bushings 104, 106 and 108. For simplicity, detailed operation of the transformer 102, and many of the individual components associated with transformer 102 are not described in detail herein, other than to the extent necessary to understand the operation and functioning of transformer 102 when tested by embodiments of the winding test unit 100. Thus, one skilled in the art will appreciate that the simplified diagram of transformer 102 illustrates only a few of the many transformer components residing on the outside of transformer 102 and none of the internal components residing inside transformer 102.

Each high voltage bushing 104, 106 and 108 has a corresponding terminal 110, 112 and 114 for coupling the high voltage side of transformer 102 to a high voltage portion the energy delivery system (not shown). Transformer 102 also includes three low voltage bushings 116, 118 and 120. Low voltage bushings 116, 118 and 120 each have a terminal 122 used to couple transformer 102 to a low voltage portion of the energy delivery system (not shown). A neutral bushing 124, having a terminal 126, also resides on transformer 102. As well known in the art, high voltage bushings 104, 106 and 108 have wire leads (not shown) which couple the terminals 110, 112 and 114 to the high voltage side of the windings (not shown) residing in transformer 102. Likewise, low voltage bushings 116, 118 and 120 have wire leads (not shown) coupling terminals 122 with the low voltage side of the windings (not shown) residing in transformer 102. Neutral bushing 124 also includes a wire connector coupling terminal 126 to an internal common point (not shown) associated with the windings (not shown) residing in transformer 102. The above-described configuration and construction of the internal components of transformer 102 are well known in the art and are not described in further detail other than to the extent necessary to understand the operation and functioning of these components when tested by the winding test unit 100.

Winding test unit 100 is coupled to the bushing terminals 110, 112 and 114 of transformer 102, via connections 128, 130 and 132, respectively. For convenience of illustration, simplified connections are shown. As will be clarified below, connections between the winding test unit 100 and transformer 102 will vary depending upon the configuration and/or the operating state of the transformer 102, and upon the embodiment of the winding test unit 100 employed for testing.

The exemplary transformer 102 illustrated in FIG. 1 is commonly known as a three phase transformer. Thus, the terminals of the three high voltage bushings 104, 106 and 108 are coupled to the terminals of the low voltage bushings 116, 118 and 120 via the windings (not shown) residing inside transformer 102. The nomenclature typically employed within the industry to identify the three phases are: phase A, phase B and phase C. Thus, a transformer 102 configured for a three phase operation would have one high voltage bushing and one low voltage bushing each associated with phase A, with phase B and with phase C. For example, high voltage bushing 104 and low voltage bushing 116 may be associated with phase A in transformer 102. Similarly, high voltage bushing 106 and low voltage bushing 118 may be associated with phase B, and high voltage bushing 108 and low voltage bushing 120 may be associated with phase C.

In accordance with embodiments of the present invention, characteristic signatures [H(f)'s] are determined for windings of interest. For convenience, a first characteristic signature H(f)1 is determined for the winding(s) between the high side bushing 104 terminal 110 and the neutral bushing 124 terminal 126. As described greater detail below, an input signal or pulse is detected at terminal 110 and a corresponding output pulse is detected at the terminal 126 by the winding test unit 100.

H(f)1 is a plot of the characteristic signature H(f) determined over a high frequency range, illustrated for convenience as between 0 Hz and 5.0 MHz (although any suitable frequency range may be employed so long as a meaningful H(f)1 is determined). Similarly, a second characteristic signature H(f)2 is determined for the winding(s) between the high side bushing 106 terminal 112 and the neutral bushing 124 terminal 126. A third characteristic signature H(f)3 is determined for the winding(s) between the high side bushing 108 terminal 114 and the neutral bushing 124 terminal 126.

Generally, corresponding windings in multi-phase transformers are similarly constructed within the normal limits of good manufacturing quality control. Although some variation between windings is expected, the similarity in construction of corresponding windings results in similar electrical performance characteristics throughout the test frequency range. That is, if the voltage is 132 kV for one winding, similar construction of the other 132 kV windings results in a predictable amount of asymmetry between same-voltage windings in good operating condition (no significant winding deformation, displacement, and/or insulation degradation). Accordingly, the characteristic signatures, H(f)'s, have detectable and uniform similarities that produce a reasonable limit to the amount of asymmetry between the H(f)'s for pairs of windings for normal winding configurations.

Significant asymmetry is indicated an outlier, or significant difference, between differential H(f)'s determined and analyzed for pairs of H(f)'s for corresponding windings in accordance with the present invention. Differential H(f)'s are determined by computing the difference between pairs of H(f)'s determined for the plurality of windings. These differential H(f)'s are compared to identify asymmetries. Accordingly, mere differences between individual H(f)'s determined for the plurality of windings, in magnitude or symmetry, are not necessarily indicative of the asymmetries determined by embodiments of the present invention.

When significant winding deformation, displacement, and/or insulation degradation occurs, the degree of asymmetry detected between compared differential H(f)'s is generally over two times the asymmetry for normal windings of the same voltage. Accordingly, such damage is detectable by asymmetries in the differential H(f)'s of the transformer windings.

In accordance with the present invention, comparison of the differential H(f)'s for a plurality of windings will identify winding deformation and/or displacement in one or more of the windings, which is indicated by a significant dissimilarity between the differential H(f)'s for the plurality of windings. Furthermore, dissimilarities in the differential H(f)'s may indicate other potential problems, such as, but not limited to, shorted turns, insulation degradation and/or carbon tracking.

In one embodiment, asymmetries for differential H(f)'s, determined from the difference between pairs of H(f)'s for a plurality of windings, is visually determined. For example, the differential H(f)'s may be plotted or graphed on paper (together, in combination or separately) so that the asymmetries can be identified. Or, raw H(f) data could be inspected. In other embodiments, the H(f)'s are computationally processed to determine asymmetries between the differential H(f)'s. The asymmetry, in one embodiment, is presented as a single number, hereinafter referred to as an asymmetrical number for convenience. If the computed asymmetrical number exceeds a predefined threshold, winding deformation, displacement, and/or insulation degradation is indicated. Furthermore, the magnitude of the computed asymmetrical number is indicative of the degree and/or the probability of winding deformation, displacement, and/or insulation degradation. An exemplary computational analysis method is described herein, however many various methods may be used to determine an asymmetrical number or its equivalent.

In one embodiment, the asymmetrical number, referred to as a weighted normalized difference number (WND), is computed. As described in greater detail below, a WND value for each pair of windings in one embodiment is generally calculated by first determining a difference between two H(f)'s at each frequency bin over the frequency range of interest, thereby determining a plurality of data values. (A frequency bin is a small predefined portion of the frequency range of interest that is used for computational convenience.) Each frequency data value is then normalized. Next, frequency data values are weighted according to a determined error function at that frequency. The weighted data values are then summed to determine a summed data value. Finally, the summed data value is multiplied by a constant to generate a weighted, normalized value. The weighted, normalized values are summed and/or averaged over the frequency range of interest. Some embodiments multiply or divide by at least one constant. Other embodiments employ one or more predetermined thresholds to further screen WND values. These embodiments are described in greater detail below and provide exemplary descriptions of computational processes whereby a plurality of winding H(f)'s are computationally compared so that the degree and/or the probability of winding deformation, winding displacement, and/or insulation degradation within and/or between the windings can be assessed.

Figure 2:
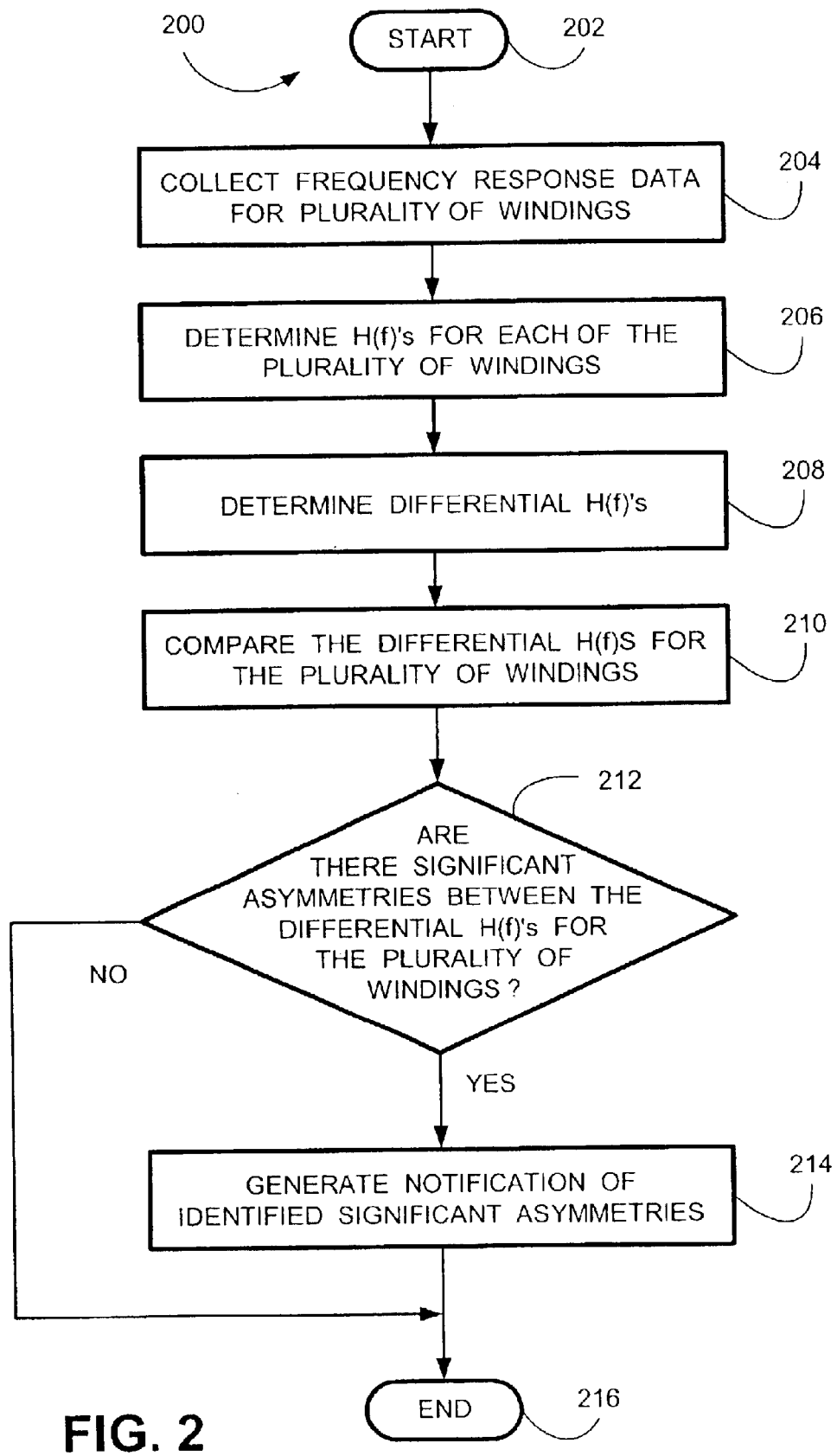
FIG. 2 is a flow chart illustrating an overview of the winding testing process and method.

FIG. 2 is a flow chart illustrating an overview of the winding testing process and method. The flow chart 200 shows the architecture, functionality, and operation of a possible implementation of the software for implementing embodiments of the present invention. In this regard, each block may represent a module, segment, or portion of code, which comprises one or more executable instructions for implementing the specified logical function(s). It should also be noted that in some alternative implementations, the functions noted in the blocks may occur out of the order noted in FIG. 2 or may include additional functions without departing significantly from the functionality of the present invention. For example, two blocks shown in succession in FIG. 2 may in fact be executed substantially concurrently, the blocks may sometimes be executed in the reverse order, or some of the blocks may not be executed in all instances, depending upon the functionality involved, as will be further clarified hereinbelow.

The process begins at block 202. At block 204, frequency response data for a plurality of windings is collected. As described in greater detail herein, such frequency response data may be collected when the transformer is off-line by applying a suitable number of test pulses or signals, or such frequency response data may be collected when the transformer is on-line by collecting data resulting from events occurring out on the electric system which propagate through the plurality of windings.

At bock 206, H(f)'s for each of the plurality of tested windings are determined. For brevity, and because the determination of H(f) for off-line and on-line testing is different, a detailed description of the processes for determining H(f) is provided hereinbelow. At block 208 differential H(f)'s are determined from differences between pairs of H(f)'s.

At block 210, the determined differential H(f)'s for the plurality of windings are compared. Exemplary comparison techniques are described in greater detail below. At block 212, a determination is made whether there are any significant asymmetries between the compared differential H(f)'s for the plurality of windings. Determining significant asymmetries are described in greater detail below. If so (the YES condition), the process proceeds to block 214 where a notification of the identified significant asymmetries is generated. The process then proceeds to block 216 and ends.

If at block 210 there are no significant asymmetries in the differential H(f)'s for the plurality of windings, the process then proceeds to block 216 and ends in one embodiment. In another embodiment, a suitable notification is generated to indicate that there are no significant asymmetries in the differential H(f)'s.

B. Computational Comparison of H(f)'s for a Plurality of Windings

As described above, the determined H(f)'s for the plurality of windings are compared to determine if there are any significant asymmetries between the differential H(f)'s. Significant asymmetries in the differential H(f)'s for a plurality of windings is indicative of winding deformation, winding displacement, and/or insulation degradation within and/or between the windings. One comparison technique is to visually compare the differential H(f)'s for a plurality of windings. However, computational techniques are advantageous in that the subjectivity of the viewer's perception of the differential H(f)'s can be avoided. Furthermore, some asymmetries may not visually appear significant, but may be in fact significant. In one embodiment, computational techniques provide a single number that indicates the likelihood of winding deformation, winding displacement, and/or insulation degradation. Such a single number makes the comprehension of the testing process very easy for the user.

As described herein, an H(f) for a winding comprises a large number of data values over a large frequency range of interest. For computational purposes, the frequency range of interest is divided up into a plurality of frequency "bins" each having a predefined frequency width, or bandwidth, such that the plurality of frequency bins span the entire frequency range of interest in a continuous non-overlapping manner. Thus, the plurality of frequency bins provide a convenient way to partition the frequency range of the characteristic signal. The data corresponding to the detected input pulse is divided up into frequency portions corresponding to the frequencies of the frequency bins according to the digitization and FFT process, and the data associated with each of the frequency bins is assigned to that frequency bin. Likewise, data associated with the detected output signal is divided up and allocated to the appropriate frequency bins. Thus, for each detected input pulse and detected output pulse, data is allocated into each one of the frequency bins during the digitization and FFT process.

For example, an exemplary frequency bin may have an assigned frequency range of 1,000 kHz to 1,010 kHz in the frequency domain. The data from the FFT of the detected input pulse corresponding to a frequency range of 1,000 kHz to 1,010 kHz is assigned to the above-described 10 kHz wide frequency bin. Likewise, the detected output pulse FFT data corresponding to a frequency range of 1,000 kHz to 1,010 kHz is assigned to the above-described frequency bin. Thus, frequency data is created having a first portion corresponding to the detected input pulse (10 kHz in width starting at 1,000 kHz) and a second portion corresponding to the detected output pulse (10 kHz in width starting at 1,000 kHz).

The frequency range of the detected input and output pulses may be divided up into any manner of frequency bins. Such bins may all be uniform in bandwidth (range of frequency allocation), or the frequency bins may have differing frequency bandwidth, without departing substantially from the operation and functionality of the present invention as described below. One embodiment employs a plurality of 3 kHz wide frequency bins. The specification of the frequency bins is determined by the specific architecture in which the winding test unit 100 is implemented and the desired degree of analytical accuracy.

One embodiment identifies pairs of windings from the plurality of windings and determines the H(f) data value difference, the differential H(f), at each bin for each of the H(f) data values for each winding pair. For example, H(f)'s for a three winding transformer may be analyzed in accordance with the present invention. Designating the windings as A, B and C, the differential H(f)'s [H(f)A−H(f)B=H(f)AB], [H(f)B−H(f)C=H(f)BC] and [H(f)C−H(f)A=H(f)CA] are determined for each frequency bin for each winding pair. When the determined differences are assembled as three differential characteristic signatures, H(f)AB, H(f)BC and H(f)CA, the three differential H(f)'s should be symmetrical with respect to each other (in the absence of winding deformation, winding displacement, and/or insulation degradation within and/or between the windings).

In one embodiment, the three differential H(f)'s comprised of the difference of H(f) data values at each bin, H(f)AB, H(f)BC and H(f)CA are plotted for visual inspection. In another embodiment, the three differential H(f)'s, H(f)AB, H(f)BC and H(f)CA are numerically screened or otherwise analytically processed to identify significant asymmetrical portions of the three differential H(f)'s across the frequency range of interest. A predefined difference or threshold value may be used to numerically identify frequency bins wherein the three differential H(f)'s exhibit asymmetries.

Other embodiments further computationally analyze the determined three differential H(f)'s. In one embodiment, the value of H(f)AB, H(f)BC and H(f)CA for each bin is normalized. Normalization may be based upon a selected one of the three differential H(f)'s, H(f)AB, H(f)BC and H(f)CA, or may be based upon an average of the three differential H(f)'s. Thus, in one embodiment, normalization is implemented by dividing each of the determined H(f) data value differences for each of the frequency bins by a corresponding H(f) data value from a selected one of the H(f)'s. In another embodiment, normalization is implemented by determining for each of the plurality of frequency bins a plurality of average H(f) data values, the average H(f) data values determined by computing the average of the H(f) data values at corresponding frequency bins, and then dividing each of the determined H(f) data value differences for each of the frequency bins by the corresponding average H(f) data value.

In another embodiment, normalization is based upon the two corresponding H(f)'s associated with a differential H(f). That is, the differential H(f) data values for each frequency bin are divided by an average H(f) data value. This single average H(f) data value is determined by summing the individual H(f) data values for all frequency bins over the frequency range, for both associated H(f)'s, and dividing by the total number of frequency bins. For example, in the three winding situation, differential H(f) data values for the differential H(f)AB are divided by a single average H(f) data value. This single average H(f) data value is determined by adding all of the H(f) data values for the H(f) for the A winding, then adding all of the H(f) data values for the H(f) for the B winding, then dividing by the total number of frequency bins in the H(f)s for both the A and B windings.

After normalization, the three normalized differential characteristic signatures, $H(f)_{\overline{AB}}$, $H(f)_{\overline{BC}}$, and $H(f)_{\overline{CA}}$, are numerically screened or otherwise analytically processed to identify significant asymmetrical portions of the three normalized differential H(f)'s across the frequency range of interest. In one embodiment, a predefined difference or threshold value is used to numerically identify frequency bins wherein the three normalized differential H(f)'s exhibit asymmetries.

In another embodiment, additional computational analysis is performed by weighting normalized differential H(f) data values using the error function, Er|H(f)|, described in greater detail below. For each frequency bin of a data pair (H(f)AB, H(f)BC and H(f)CA), the normalized differential H(f) data value is multiplied by $(1-Er|H(f)|)^2$ for the error value associated with the first H(f) of the selected pair, multiplied by $(1-Er|H(f)|)^2$ for the error value associated with the second H(f) of the selected pair, and then divided by (1-average Er|H(f)| data value)$^2$, where the average Er|H(f)| data value is determined by summing the individual Er|H(f)| data values for all frequency bins over the frequency range, for both associated H(f)'s, and dividing by the total number of frequency bins. For example, in the three winding situation, normalized differential H(f) data values for the differential H(f)AB are multiplied by $(1-Er|H(f)|)^2$ for the error value associated with the H(f) of the A winding, multiplied by $(1-Er|H(f)|)^2$ for the error value associated with the H(f) of the B winding, and then divided by (1-average Er|H(f)| data value)$^2$. The single average Er|H(f)| data value is determined by adding all of the Er|H(f)| data values for the H(f) for the A winding, then adding all of the Er|H(f)| data values for the H(f) for the B winding, then dividing by the total number of frequency bins in the H(f)s for both the A and B windings.

In another embodiment, after multiplying as described above, the multiplied determined normalized differential H(f) data values are averaged, then multiplied by a constant, to determine a resultant number. Then the resultant number is divided by (1-average Er|H(f)| data value)$^2$. In one embodiment, the constant is 1000.

After normalization, the three weighted, normalized differential characteristic signatures, $H(f)_{\overline{ABw}}$, $H(f)_{\overline{BCw}}$, and $H(f)_{\overline{CAw}}$ are numerically screened or otherwise analytically processed to identify significant asymmetrical portions of the three weighted, normalized differential H(f)'s across the frequency range of interest. In one embodiment, a predefined difference or threshold value is used to numerically identify frequency bins wherein the three weighted, normalized differential H(f)'s exhibit asymmetries.

The above described embodiments that computationally or visually analyze the various forms of the characteristic differential signatures H(f) may present results that need subjective interpretation by the user. In one embodiment, additional computation results in the determination of a weighted normalized difference (WND) value. The WND value is a single number that corresponds to an aggregation of the H(f) differences for the bins over the frequency range of interest. Accordingly, in the exemplary three winding example, a WND value for each pair of windings is determined ($WND_{AB}$, $WND_{BC}$ and $WND_{CA}$) by summing or averaging the weighted, normalized H(f) differences over the frequency range of interest. If the WND values determined for the pairs of windings are approximately the same, symmetry of the characteristic signatures is indicated. Thus, the likelihood of winding deformation, winding displacement, and/or insulation degradation is low.

However, relatively large asymmetries in the WND values indicate a higher likelihood of winding deformation, winding displacement, and/or insulation degradation. If there are gross asymmetries in the WND values, likelihood of winding deformation, winding displacement, and/or insulation degradation is high. Any desirable number of predefined thresholds may be used, thereby defining a plurality of ranges for WND value differences. A likelihood or probability of winding damage is then associated with each range.

Another embodiment recomputes the WND values determined for the pairs of windings to generate a number that is more meaningful to the user. In some embodiments, the WND values are divided or multiplied by a constant. In another embodiment, the WND values may additionally be divided by a number corresponding to the computed error.

For example, if two WND values are 0.000000012 and 0.0000012, the significance in the difference in the exemplary WND values may not be readily apparent to the user. However, if the two exemplary WND values are multiplied by $10^8$, the first WND value becomes 1.2 and the second WND value becomes 120. Accordingly, the user is more likely to comprehend that the difference between 1.2 and 120 is significant (assuming that such a difference is, in fact, significant as described above and in accordance with the present invention). It is understood that an unlimited variety of computational methods can be used by embodiments of the present invention to present WND values that are readily understood by the user.

In another embodiment, winding asymmetry values are given in percent. For example, the average of the two highest WND values may be divided by the lowest WND value for the three windings under comparison, subtract one, and then convert to percent. Such a process, in one embodiment that tests three windings, averages a first WND value and a second WND value to determine an average value at each frequency bin, divides the average value by a third WND value to determine an aggregate WND value, subtracts one from the aggregate WND value to determine a final WND value, and converts the final WND value to a percentage. In the above-described embodiment, the first WND value and the second WND value are the two highest of the three WND values at each in. In other embodiments, other criteria may be used to select the WND values. For example, the first, second and third WND values may correspond to the first, second and third differential H(f)'s.

Another embodiment further computationally analyzes differences between the WND values, and based upon at least one predefined criteria, generates a notification that is easily understood by the user. For example, if the difference between WND values are grossly and significantly different, the notification may simply state "WINDING DAMAGE PRESENT" or a like statement to indicate that winding conditions are not acceptable. Furthermore, color coding may be employed, such as communicating the above message in red.

When a plurality of predefined criteria are used to analyze the WND values, one embodiment uses a first threshold to demark WND asymmetries that indicate no transformer damage or that conditions are acceptable. When the embodiment includes color coding of messages, the message is communicated in green or another suitable color that is associated with normal operating conditions when WND asymmetries are less that the first threshold. A second predefined threshold is used to demark differences between conditions where there is some probability of damage to the windings and conditions where the probability of damage is very high (or even certain). If color coded messages are employed, WND asymmetries between the first predefined threshold and the second predefined threshold cause messages to be communicated in orange, yellow or another suitable color that is associated with a warning condition. WND asymmetries that exceed the second predefined threshold cause messages to be communicated in red or another suitable color that is associated with a dangerous operating condition or that conditions are not acceptable.

The above-described exemplary embodiment described a variety of ways H(f)'s for three winding are numerically screened or otherwise analytically processed to detect significant asymmetries in the H(f)'s of the windings. The above-described process is equally applicable to comparing any plurality of windings that are similarly constructed. Such windings may be in separate transformers, such as in multiple single-phase transformers, or as in multiple three-phase transformers, so long as the winding construction is sufficiently similar that H(f)'s determined from undamaged windings are sufficiently symmetric to each other. Accordingly, winding deformation, winding displacement, and/or insulation degradation is detectable when asymmetries are detected in the H(f)'s.

Similarly, the device in which the plurality of windings are employed is not limiting. For convenience, windings were described as residing in a three phase transformer. The winding test unit of the present invention is equally applicable for detecting winding deformation, winding displacement, and/or insulation degradation in other devices, such as motors, generators, phase shifting transformers, reactors or the like.

Furthermore, for convenience, the winding test units of the present invention was described as testing the high side windings of the three phase transformer 102. The winding test units of the present invention are equally applicable in determining winding deformation, winding displacement, and/or insulation degradation in the low voltage windings by testing between the low voltage terminals 122 and the neutral bushing 124 terminal 126. In autotransformers (where the low voltage winding is a portion of the overall or high voltage winding), the entire length of the windings may be tested or selected portions of the windings may be tested, depending upon the availability of terminals that tap into the windings. Furthermore, in transformers with multiple winding taps, winding portions between tap positions may be tested by the winding test units of the present invention. Tertiary windings may also be tested using winding test units of the present invention.

Electromagnetic and/or capacitive coupling may be incorporated into the above-described testing process. That is, in a transformer wherein the high voltage phase and the low voltage phase are electrically insulated from each other, winding test units of the present invention can be coupled to the high voltage terminal and the low voltage terminal. Accordingly, the coupling between the high voltage winding and the low voltage winding is tested as an equivalent single winding as described above. That is, the high voltage winding and the low voltage winding, which are electromagnetically and/or capacitively coupled, are tested together such that H(f)'s are determined for each high voltage winding and the low voltage winding pair. H(F)s for pairs of high voltage winding and the low voltage winding pairs are then analyzed to identify asymmetries that are indicative of winding deformation, winding displacement, and/or insulation degradation. Such techniques are suitable to testing transformers that employ various types of wye and delta (Y-Δ) configurations.

C. An Embodiment for Testing an Off-Line Transformer

Figure 3:
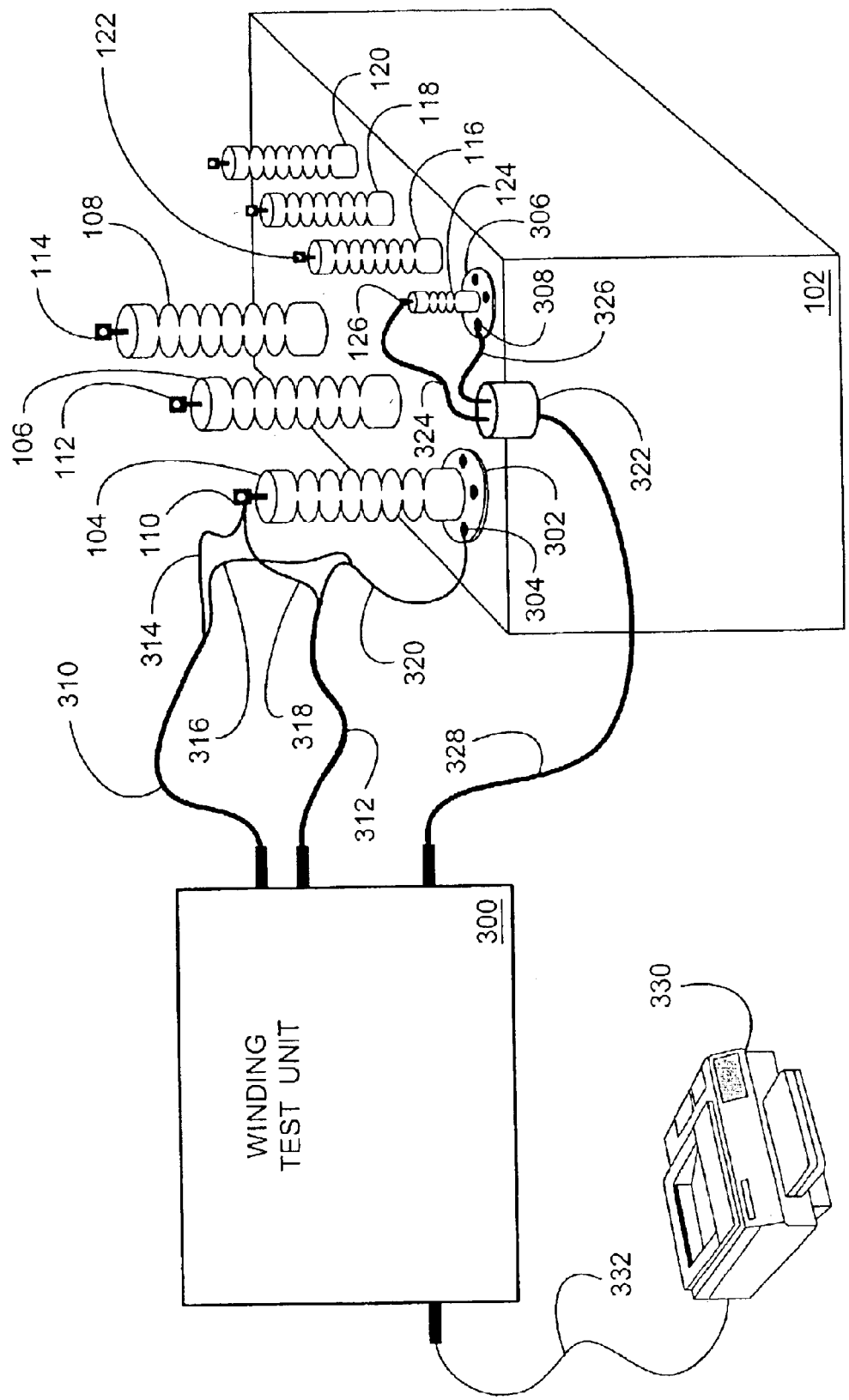
FIG. 3 is a block diagram of an embodiment of a winding test unit coupled to an off-line transformer.
Figure 4:
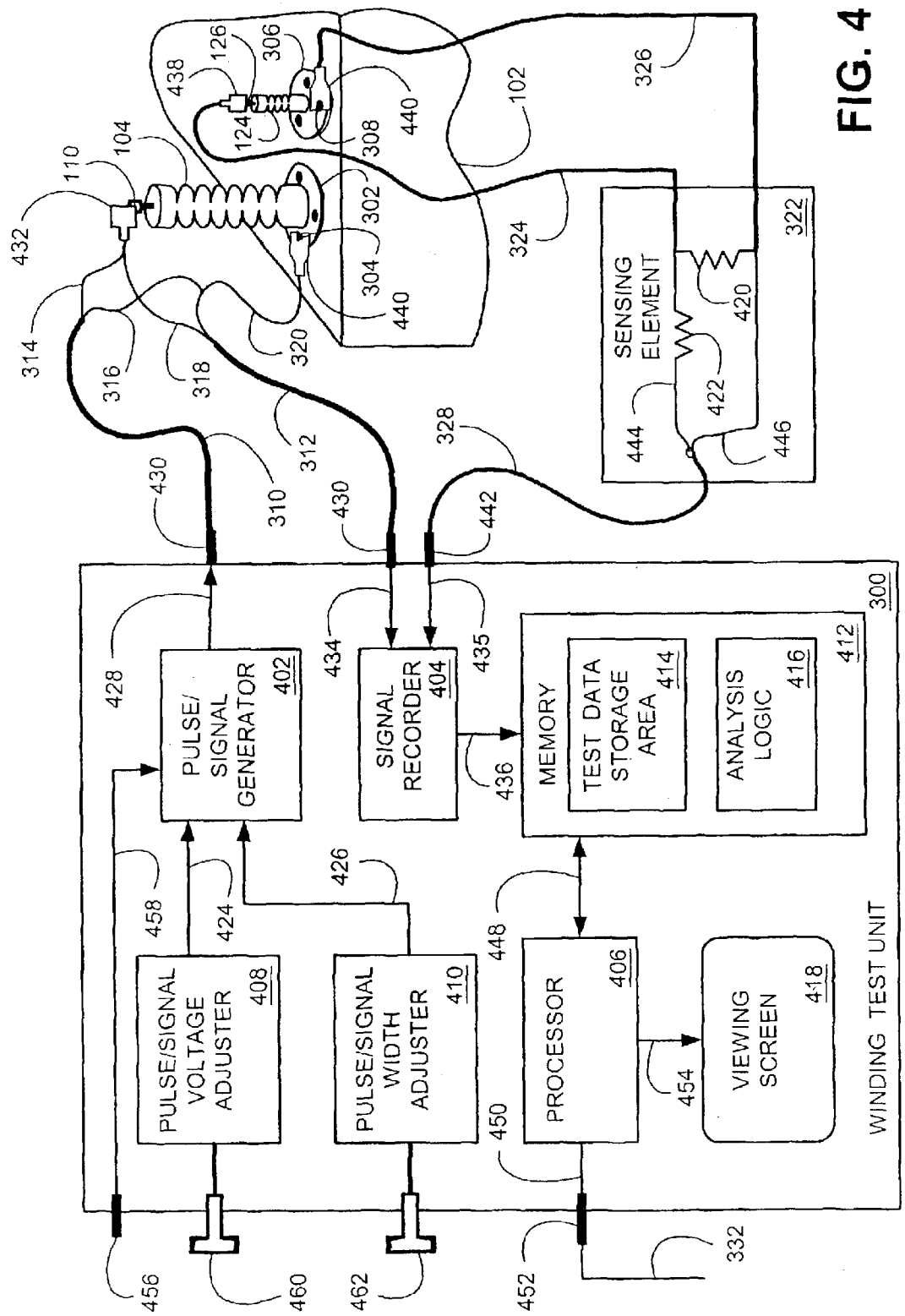
FIG. 4 is a block diagram illustrating selected components residing in the winding test unit configured to test the off-line transformer of FIG. 3.

FIG. 3 is a block diagram of an embodiment of a winding test unit 300 coupled to an off-line transformer 102. FIG. 4 is a block diagram illustrating selected components residing in the winding test unit 300 configured to test the off-line transformer 102 of FIG. 3.

Transformer 102 is illustrated as being off-line (or de-energized). That is, transformer 102 is not coupled to the electric system. For convenience of explaining the determination of an H(f) for one winding of interest, the winding test unit 300 is illustrated to test one high voltage winding of transformer 102. Accordingly, in the illustrated embodiment of the winding test unit 300, connections are moved to the terminals 112 and then 114 to test the other windings so that H(f)'s for the other two high voltage windings of interest are determined. In another embodiment, additional connections (not shown) are provided on the winding test unit 300 so that all of the windings may be tested without having to move the test point connections to test each winding.

Another embodiment further includes a sufficient number of connections to connect the winding test unit 300 to one or more of the low voltage terminals 122. Accordingly, H(f)'s for a plurality of electromagnetically and/or capacitively coupled high and low voltage windings can be determined, and/or H(f)'s for a low voltage winding can be determined from the same applied test signals or pulses applied when a high voltage winding is tested.

High voltage bushing 104 is mounted to transformer 102 with a mounting flange 302 that is fixably attached to the bottom of the high voltage bushing 104. Mounting flange 302 is securely affixed to the top of transformer 102 with a plurality of bolts 304, nuts or other similar attaching devices. Similarly, high voltage bushings 106 and 108, and low voltage bushings 116, 118 and 120 have similar mounting flanges (not shown) which affix the bushings to transformer 102. Neutral bushing 124 has a mounting flange 306 and is secured to transformer 102 with bolts 308 or the like.

Winding test unit 300, as illustrated in FIG. 3, is coupled to transformer 102 via connection 310 so that a pulse or signal generated by winding test unit 300 is applied to terminal 110 of high voltage bushing 104 in a manner described below. Connection 312 provides a signal to a detector (not shown) within the winding test unit 300 so that the pulse or signal is detected. In one embodiment, connections 310 and 312 are coaxial cables. Alternative embodiments employ similarly suitable multiple wire connections.

Describing in greater detail, a first connection 314, such as the center conductor of a coaxial cable 310, is coupled to terminal 110, thereby providing connectivity between connection 310 and terminal 110. A second connection 316, such as the shield wire of a coaxial cable 310 (or another wire coupled to the shield wire), is coupled to a convenient location on connection 320. Alternatively, connection 316 may be coupled to the mounting flange 302, preferably attached by coupling to a selected mounting bolt 304. Similarly, connection 312 has two wires, such as a coaxial cable in one embodiment. More specifically; in one embodiment, a first connection 318, such as the center wire of a coaxial cable 312, is coupled to terminal 110 and a second connection 320, such as the shield wire of a coaxial cable 312, is coupled to mounting flange 302. Another embodiment employs a series resistance (not shown) coupled to connection 318 near the location of terminal 110 to provide a matching characteristic impedance to connection 312. Alternatively, connection 316 may be coupled to a convenient location on connection 320, and connection 316 may be coupled to mounting flange 302 using a selected mounting bolt 304. Thus, connections 316 and 320 form a path across high voltage bushing 104 that approximates the dry arching distance of the bushing insulation.

In the embodiment illustrated in FIG. 3, the connection 314 residing in connection 310 transmits the generated pulse or signal to terminal 110, and is physically separate from connection 312 so that the applied pulse or signal is more accurately detected. However, alternative embodiments may employ a connection 312 coupled to other alternative convenient locations so that the generated pulse or signal applied to terminal 10 is detected.

Sensing element 322 is communicatively coupled to terminal 126 of the neutral bushing 124 via connection 324. Also, sensing element 322 is communicatively coupled to the neutral bushing mounting flange 306 via connection 326 to form a series path across the external insulation of the neutral bushing 124 in a manner that approximates the dry arching distance of the bushing insulation. In one embodiment, connections 316, 320 and 326 may be implemented with a low inductance connector such as, but not limited to, a flat copper braid, copper ribbon, or other suitable low inductance metallic connector. Using low inductance connectors insures that the characteristic signature, described below, is determined in a large part by the internal leads and the windings of transformer 102, and thereby minimizing the impact of the external connections used to couple the winding test unit 300 to transformer 102.

When a pulse or signal is generated by winding test unit 300 and applied to connection 314, the pulse or signal propagates through terminal 110, through the high voltage bushing 104, through the windings (not shown), and out to terminal 126 of the neutral bushing 124. A detector (not shown) residing in the winding test unit 300 detects the generated pulse or signal applied to terminal 110. Sensing element 322 detects the output pulse or signal on terminal 126. Sensing element 322 outputs a signal corresponding to the output pulse or signal detected at terminal 126 to the winding test unit 300 via connection 328. Summarizing, winding test unit 300 applies an input pulse or signal to terminal 110 and receives signals corresponding to the input pulse or signal at terminal 110 and the output pulse or signal at terminal 126.

For convenience, winding test unit 300 is illustrated as being coupled to printer 330 via connection 332. Thus, upon conclusion of the testing of transformer 102 and the associated analysis of the input and output pulses or signals, winding test unit 300 outputs one or more suitably formatted reports to printer 330 for printing. One skilled in the art will appreciate that the winding test unit 300 is configured to output any of a variety of suitable output signal formats. For example, another embodiment of winding test unit 300 is configured to provide output to a display screen such as a cathode ray tube (CRT) or other suitable display screen. Another embodiment of winding test unit 300 is configured to provide an output signal that is stored on a suitable storage media. Examples of suitable storage media include, but are not limited to, any one or combination of volatile memory elements (e.g., random access memory (RAM, such as DRAM, SRAM, etc.)) and nonvolatile memory elements (e.g., ROM, hard drive, tape, CDROM, etc.). Moreover, suitable storage media may incorporate electronic, magnetic, optical, and/or other types of storage media. Note that the suitable storage media can have a distributed architecture, where various components are situated remote from one another, but can be accessed by the winding test unit 300, either directly or indirectly. Such an embodiment of the winding test unit 300 would be particularly suitable for providing documentation of test results, for storing test results in a centralized location for future use, and/or for analyzing test results in additional detail.

FIG. 4 is a block diagram illustrating selected components residing in the winding test unit 300 and the sensing element 322 of FIG. 4. As noted above, the winding test unit 300 is configured to test one winding of the transformer 102. Other embodiments are configured to test a plurality of windings of interest. Accordingly, duplicate components are included in such embodiments for testing other windings. Alternatively, some of the components illustrated in the winding test unit 300 may be commonly used during testing of multiple windings.

Winding test unit 300 includes at least a pulse/signal generator 402, a signal recorder 404, a processor 406, a pulse/signal voltage adjuster 408, a pulse/signal width adjuster 410 and a memory 412. Memory 412 includes a test data storage area 414 and the analysis logic 416. An optional viewing screen 418 is also included with the winding test unit 300. Sensing element 322 includes a low inductance resistive element 420 and a series resistive element 422 to impedance match connection 328.

Pulse/signal generator 402 is configured to generate a pulse or signal. The magnitude of the pulse or signal generated by the pulse/signal generator 402 is specified by an input from the pulse/signal voltage adjuster 408, provided over connection 424, that specifies the peak voltage magnitude of the pulse or signal. The width of the pulse or signal generated by the pulse/signal generator 402 is determined by a signal from the pulse/signal width adjuster 410, over connection 426. Pulse/signal voltage adjuster 408 may be implemented using well known components and methods employed in the art of adjusting voltages. Similarly, pulse/signal width adjuster 410 may be implemented using well known components and methods employed in the art of adjusting the width of a pulse or signal. Detailed operation of individual components used in the pulse/signal voltage adjuster 408 and/or the pulse/signal width adjuster 410 are not described in detail herein, other than to the extent necessary to understand the operation and functioning of these components when employed as part of the winding test unit 300. One skilled in the art will realize that the pulse/signal voltage adjuster 408 and the pulse/signal width adjuster 410 may be implemented using any one of a number of well known devices and that such devices are too numerous to conveniently describe in detail herein. In another embodiment, the pulse or signal rise-time, and/or fall-time, may be varied. Any such well known devices which adjust voltage magnitude, width, rise-time and/or fall-time of a pulse or signal may be implemented in a winding test unit 300 without departing substantially from the functionality and operation of the present invention. Any such variations in a winding test unit 300 which utilizes the system and method of the present invention to generate a pulse or signal having a suitable voltage and a suitable width are intended to be within the scope of this disclosure and to be protected by the accompanying claims.

Based upon the voltage specified by the pulse/signal voltage adjuster 408 and the width of the pulse or signal specified by the pulse/signal width adjuster 410, pulse/signal generator 402 is prompted to generate a pulse or signal onto connection 428. Connection 428 of the winding test unit 300 is coupled to connection 310, thereby providing connectivity to terminal 110 of the high voltage bushing 104 on transformer 102. In one embodiment connection 310 is configured to couple to connection 428 with a commonly available plug-in attachment 430. Examples of plug-in attachment 430 include, but are not limited to, a commercially available banana plug, coaxial cable connector, alligator clip, lug or screw. Alternatively, connection 310 is fixably attached to connection 428, thereby providing a secure connection to connection 428. Connection 310 employs a releasable fastener 432 so that connection 310 is easily and conveniently coupled to terminal 110. Examples of a suitable releasable fastener 432 include, but are not limited to, a clamp, a bolt, a clasp, a c-clamp, or a specially designed and fabricated terminal connector.

Signal recorder 404 detects the pulse or signal generated by the pulse/signal generator 402, via connection 434, at terminal 110. In one embodiment, connection 312 is a connector of suitable length and flexibility that is configured to conveniently couple to connection 434 and to terminal 110. For example, connection 312 may be configured to couple with connection 434 with a commonly available plug-in attachment 430, as described above. Thus, an embodiment of the winding test unit 300 employing connection 312 provides for the detection of the pulse or signal that is applied to terminal 110, thereby avoiding the influence of any distortions that may be introduced by connections 428 and 310. An alternative embodiment directly detects the generated pulse or signal at an alternative convenient location, or directly from the pulse/signal generator 402. Signal recorder 404 transmits a suitable formatted data signal corresponding to the detected input and output pulses or signals to memory 412, via connection 436, for storage in the test data storage area 414.

Sensing element 322 is coupled to terminal 126 of the neutral bushing 124 as described below. Resistive element 420 residing in the sensing element 322 is coupled to terminal 126 of the neutral bushing 124 via connection 324 using a suitable connector, such as releasable fastener 438. Releasable fastener 438 is similar to releasable fastener 432 described above. Resistive element 420 is also coupled to mounting flange 306, via connection 326. A suitable connector 440 is used to provide a secure electrical connection between connection 324 and mounting flange 306. Connector 440 is shown as a spade-type connector particularly suitable for connecting to a readily accessible bolt 308, nut or the like residing on transformer 102. However, connector 440 may be any suitable connector that provides a secure electrical connection between connection 326 and mounting flange 306. Similarly, connections 320 and 316 are coupled to a selected mounting bolt 304 with a connector 440.

Furthermore, for convenience of illustration, connections 324 and 326 are illustrated as fixably attached to resistive element 420. Alternatively, connections 324 and/or 326 could be coupled to resistive element 420 using a suitable plug-in attachment similar to plug-in attachment 430 described above.

Connection 328 couples the series resistive element 422 residing in sensing element 322 to the winding test unit 300. Connection 328 is coupled to the winding test unit 300 with a suitable plug-in attachment 442. For convenience of illustration, connection 328 is illustrated as fixably attached to resistive element 422 via connections 444 and 446. Alternatively, connection 328 could be coupled to connections 444 and 446 using a suitable plug-in attachment similar to plug-in attachment 430 described above.

When connection 328 couples sensing element 322 to winding test unit 300, connection 444 is coupled to the sensing element 322 such that signal recorder 404, via connection 435, can detect and record signals from sensing element 322. Such detected signals are stored in the test data storage area 414.

Sensing element 322 is illustrated as having a shunt resistive element 420 and a series resistive element 422. In the preferred embodiment, resistive element 420 is a resistor having a resistance substantially equaling 10 Ohms. Series resistive element 422 is substantially equal to 75 Ohms in one embodiment. Thus, the resistive elements 420 and 422 are configured to substantially match the impedance characteristics of connection 328 so that the output pulse or signal is accurately detected. One skilled in the art will appreciate that the values of resistive elements 420 and 422 may be selected so that the output pulse or signal detected at terminal 126 is suitably detected and so that a suitable output signal is provided over connection 328. One skilled in the art will realize that any number of suitable values and/or combinations of resistive elements 420 and 422 may be selected, and that such values and/or combinations are too numerous to conveniently describe in detail herein. Thus, any suitable combination of a resistive elements 420 and 422 that provides a suitable output signal on connection 328, may be implemented in a sensing element 322 without departing substantially from the functionality and operation of the present invention. Any such variations in a sensing element 322 coupled to a winding test unit 300 which utilizes the system and method of the present invention are intended to be within the scope of this disclosure and to be protected by the accompanying claims.

Processor 406 is coupled to memory 412 via connection 448, which may include one or more buses. Processor 406, as described hereinafter, accesses the analysis logic 416 residing in memory 412 and the recorded signals described above residing in the test data storage area 414 so that a new characteristic signature of transformer 102 may be determined. Processor output connection 450 is coupled to connection 332 so that a suitable output report may be provided to the testing personnel. For convenience of illustration, connection 450 is coupled to connection 332 with a plug-in attachment 452. Plug-in attachment 452 is similar to the plug-in attachment 430 described above. However, alternative embodiments may employ other types of connectors, or connection 450 may be fixably attached to connection 332, without departing substantially from the operation and functionality of the present invention.

Additionally, in one embodiment, processor 406 is coupled to an optional viewing screen 418 via connection 454. The optional viewing screen 418 is used by the testing personnel to view the generated pulse or signal from pulse/signal generator 402, the signal corresponding to the detected output pulse or signal on terminal 126 of the neutral bushing 124, and/or the output reports generated by processor 406. Viewing screen 418 may be any suitable device for displaying an output signal. For example, but not limited to, viewing screen 418 may be a cathode ray tube (CRT), a flat panel screen, a light emitting diode (LED) screen, liquid crystal display (LCD), or any other well known screen device. A winding test unit 300 employing any suitable viewing screen embodiment is intended to be within the scope of this disclosure and protected by the accompanying claims.

Summarizing, when winding test unit 300 and sensing element 322 are coupled to one of the windings of transformer 102 as described above, a pulse or signal generated by pulse/signal generator 402 propagates through the transformer windings (not shown) and an output pulse or signal is detected by sensing element 322. A signal corresponding to the generated input pulse or signal and a signal corresponding to the detected output pulse or signal is provided to signal recorder 404 for storage in the test data storage area 414 on memory 412.

Preferably, a plurality of test signals are applied to each winding of interest. As described in greater detail below, multiple windings electromagnetically coupled to each other can be tested in the same manner as described above for a single winding. Since the present invention determines the presence and/or likelihood of winding deformation, winding displacement, and/or insulation degradation by analyzing symmetry of the H(f)'s for a plurality of windings, testing of the plurality of windings must occur within a reasonably short time period, referred to herein as a predefined testing time period. Generally, this testing time period can be as long as the transformer is in the de-energized state. If the transformer is energized before completion of the test, and an event occurs that may cause winding deformation, winding displacement, and/or insulation degradation, previously collected test data may no longer be valid. Accordingly, it is desirable that the winding testing according to the present invention be completed within the time period that the windings are de-energized.

As described above, pulse/signal generator 402 is prompted to generate a pulse or signal onto connection 428. A person conducting a test using winding test unit 300 and sensing element 322, hereinafter referred to as the testing personnel, prompts pulse/signal generator 402 to generate a pulse or signal onto connection 428 by actuating actuator 456. Actuator 456 provides a signal over connection 458 to the pulse/signal generator 402 such that the pulse/signal generator 402 generates the desired pulse or signal. Actuator 456 may be implemented using any suitable type actuating device configured to generate a signal that is suitable for prompting pulse/signal generator 402 generate the desired pulse or signal. Examples of actuator 456 include, but are not limited to, push button switches, single pull-single throw switches, touch pads, touch sensors or other similar devices that respond to a command provided by the testing personnel. Any such well known actuator 456 may be implemented in a winding test unit 300 without departing substantially from the functionality and operation of the present invention. Any such variations in the device used to implement actuator 456 in a winding test unit 300 which utilizes the system and method of the present invention is intended to be within the scope of this disclosure and to be protected by the accompanying claims.

The testing personnel during the testing of transformer 102, as described in detail below, may elect to adjust the voltage of the pulse or signal generated by pulse/signal generator 402. An actuator 460, conveniently accessible from the outside of winding test unit 300, is coupled to the pulse/signal voltage adjuster 408 so that the testing personnel may adjust the voltage of the generated pulse or signal. In one embodiment, actuator 460 is a control dial. However, actuator 460 may be any other suitable device which enables the testing personnel to actuate the pulse/signal voltage adjuster 408 such that the voltage of the pulse or signal generated by pulse/signal generator 402 is adjusted. For example but not limited to, actuator 460 could be implemented as a digital numeric entry system, a keypad device, or an appropriately configured switching device which may be software controlled. Similarly, the testing personnel during testing of transformer 102 may elect to adjust the width of the pulse or signal generated by pulse/signal generator 402. Actuator 462 is coupled to the pulse/signal width adjuster 410 so that the pulse or signal width may be adjusted. Like actuator 460, in one embodiment actuator 462 is a control dial. However, actuator 462 may be implemented using the alternative devices like those described above for actuator 460.

D. Off-Line Testing to Determine H(f) Data

With reference to FIG. 3, winding test unit 300 is coupled to transformer 102 as described above. As described below for convenience, determining H(f) is disclosed for a single winding, or an electromagnetically and/or capacitively coupled winding group, depending upon where the winding test unit 300 connectors are coupled to transformer 102. In accordance with the present invention, the process described below is repeated, or performed concurrently, for each of the plurality of windings (or the plurality of electromagnetically and/or capacitively coupled winding groups) of interest so that a plurality of corresponding H(f)'s are determined. As noted above, an alternative embodiment of a winding test unit 300 includes a plurality of connections so that a plurality of windings may be concurrently or simultaneously tested.

A plurality of pulses or signals generated by pulse/signal generator 402 propagates through the transformer windings (not shown) and an output pulse or signal is detected. A signal corresponding to the generated input pulse or signal and a signal corresponding to the detected output pulse or signal is provided to signal recorder 404 for storage in the test data storage area 414 on memory 412.

Preferably, generated test signals differ from each other. For example, rise times, decay times, signal form, magnitudes, the time of the chop, the chop time and/or other various characteristics of the pulses may differ. One or several or any combination of the pulse parameters described above may be altered from one test pulse to the next. Any variety of suitable pulse or suitable signals may be generated by the winding test unit 300 such that the input pulse or signal has sufficient energy to propagate through the tested windings, and such that the characteristics of the input pulse or signal are sufficient to provide a suitable output pulse or signal detectable at terminal 126. Thus, the testing personnel performing the transformer test using winding test unit 300 determines the appropriate voltage and pulse width of the input pulse or signal applied to the transformer windings such that a suitable output pulse or signal is detected. An alternative embodiment of the winding test unit 300 is configured to automatically adjust the characteristics of the input pulse or signal, either randomly or by a predefined algorithm.

Data corresponding to the detected input and output pulses are then simultaneously digitized and processed by FFT to be allocated to a plurality of predefined frequency bins. Thus, for each of the detected input pulses and output pulses, a frequency domain data point is stored in each one of the frequency bins. Next, the analysis process computes the auto-spectral densities and a cross-spectral density of each of the data points for each frequency bin, as described below.

For each frequency bin, the auto-spectra $G_{xx}(f)$ is calculated by computing the complex conjugate (*) of the Fast Fourier Transform (FFT) of the input pulse or signal, $X(f)^*$, and then multiplying by the FFT of the same input pulse or signal, $X(f)$, as shown in equation 1 below:

$$G_{xx}(f) = [X(f)^*]X(f) \qquad \text{Eq. 1}$$

Where $X(f)$ is the FFT of the input signal $x(t)$

Then, for each frequency bin, the auto-spectra $G_{yy}(f)$ is calculated by computing the complex conjugate (*) of the FFT of the output pulse or signal, $Y(f)^*$, and then multiplying by the FFT of the same output pulse or signal, $Y(f)$, as shown in equation 2 below:

$$G_{yy}(f) = [Y(f)^*]Y(f) \qquad \text{Eq. 2}$$

Where Y(f) is the FFT of the output signal y(t)

The cross-spectra $G_{xy}(f)$ from input to output is calculated by computing the complex conjugate (*) of the FFT of the input pulse of signal, X(f)*, and multiplying by the FFT of the output pulse or signal, Y(f), as shown in equation 3 below:

$$G_{xy}(f)=[X(f)^*]Y(f) \qquad \text{Eq. 3}$$

Where X(f) is the FFT of the input signal x(t)
And Y(f) is the FFT of the output signal y(t)

A new characteristic signature of the tested transformer winding, H(f), in accordance with the system and method of the present invention, is calculated by averaging a suitable number of the cross-spectra $G_{xy}(f)$ for each one of the input/output pulse or signal data pairs, and dividing by the corresponding averages of the auto-spectra for each one of the input pulse or signals, $G_{xx}(f)$, in accordance with equation 4 below:

$$H(f)=G_{xy}(f)/G_{xx}(f) \qquad \text{Eq. 4}$$

The above-described analysis process is further enhanced by incorporating a coherence analysis of the test data. A coherence function $\gamma^2_{xy}(f)$ is calculated, as shown in equation 5 below:

$$\gamma^2_{xy}(f)=|G_{xy}(f)|^2/G_{xx}(f)G_{yy}(f) \qquad \text{Eq. 5}$$

The coherence function $\gamma^2_{xy}(f)$ is a real valued function having a magnitude ranging from 0 to 1 for each frequency bin of H(f). A value of 1 would indicate a perfect linear relationship from the input pulse portion to the detected output pulse portion for the various frequency bins in the frequency domain. A value of 0 would indicate a complete non-linear relationship between the input and detected output pulse portions in the frequency bins. A value of 0 would also indicate insufficient energy for the frequencies of interest in the input pulse to transfer to the output pulse. The coherence function $\gamma^2_{xy}(f)$ is very sensitive to relatively small errors in the magnitude (or phase) estimate for the characteristic signature, H(f). Thus, data for a particular winding test should not be considered invalid when the coherence function $\gamma^2_{xy}(f)$ is not equal to 1, but should be weighted accordingly by objective analysis in the test set logic and using good engineering judgment by the testing personnel or other individuals analyzing test results. That is, the coherence function $\gamma^2_{xy}(f)$ indicates the reliability of the test data over the computed frequency range.

Generally, the testing personnel or individual analyzing the test results would review a plot of the coherence function $\gamma^2_{xy}(f)$ over some relevant frequency range. As a rule of thumb, test data may be considered valid for the frequencies having a coherence value of between 1.0 and 0.8. However, test data may be considered as providing useful information for the frequencies having a coherence value of between 0.8 and 0.4. Test data having a coherence value of between 0.4 and 0.0 may be considered as an indication that the computed characteristic signature for those frequencies may be unreliable, and that further testing of the transformer windings to obtain more reliable test data is desirable or that the data for those frequencies should be given little weight in determining the likelihood of winding deformations. Thus, the above rules of thumb will be appreciated by one skilled in the art as merely generalizations for initially interpreting a plot of the coherence function $\gamma^2_{xy}(f)$ over a frequency range of interest. That is, the testing personnel or the individual analyzing the test data may use the coherence function $\gamma^2_{xy}(f)$ as an analysis tool in evaluating the validity and reliability of the test data when determining the likelihood of winding deformation and/or displacement.

The above-described analysis process is further enhanced by incorporating a random error analysis of the test data. The error function indicates the validity of the test data with respect to the applied input pulse or signal and the detected output pulse or signal. For example, if a secure contact is not provided by the connectors, the error function will indicate such. Thus, the error function will not increase significantly for a change due to transformer winding deformation and/or displacement.

A random error function $E_r|H(f)|$ is calculated, as shown in equation 6 below:

$$E_r|H(f)|=[1-\gamma^2_{xy}(f)]^{1/2}/|\gamma_{xy}(f)|(2n_d)^{1/2} \qquad \text{Eq. 6}$$

The term nd equals the number of spectral densities averaged in the H(f) equation.

The random error, $E_r|H(f)|$, provides a statistical analysis of the test data random error in each frequency bin based on a 95% confidence interval equation. The testing personnel or the individual analyzing the test data may conveniently analyze and interpret the calculated random errors by plotting the random error over a frequency range of interest. Such a graph will result in two lines being plotted over the frequency range of interest, with the spacing between the two lines indicating the 95% confidence interval for the test data. When the two plotted lines indicating the 95% confidence interval are relatively close together, the testing personnel or the individual analyzing the test data may conclude that the test data is reliable. When the two plotted lines indicating the 95% confidence interval are relatively far apart, the testing personnel or the individual analyzing the test data may conclude that the test data is not reliable, and that further testing of the transformer windings to obtain more reliable test data is desirable or that the data for those frequencies should be given little weight in determining the likelihood of winding deformations. Thus, the plot of the 95% confidence interval will be appreciated by one skilled in the art as an indication of the validity and reliability of the characteristic signature, H(f), over a frequency range of interest. That is, the testing personnel or the individual analyzing the test data may use the 95% confidence interval as an analysis tool in evaluating the validity and reliability of the test data when determining the likelihood of winding deformation and/or displacement.

E. An Embodiment for Testing an On-Line Transformer

Figure 5:
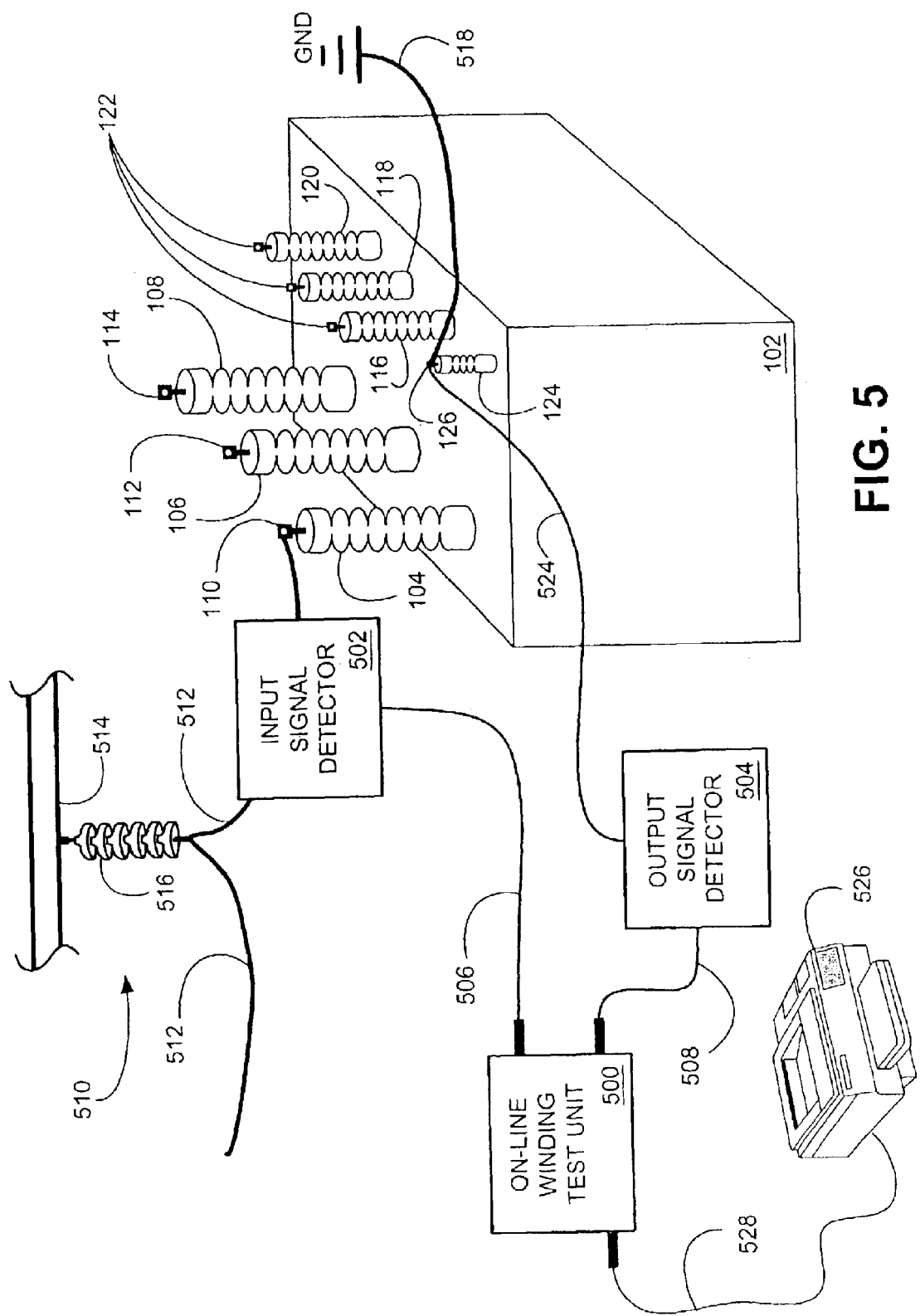
FIG. 5 is a block diagram of an embodiment of a winding test unit coupled to an on-line transformer.
Figure 6:
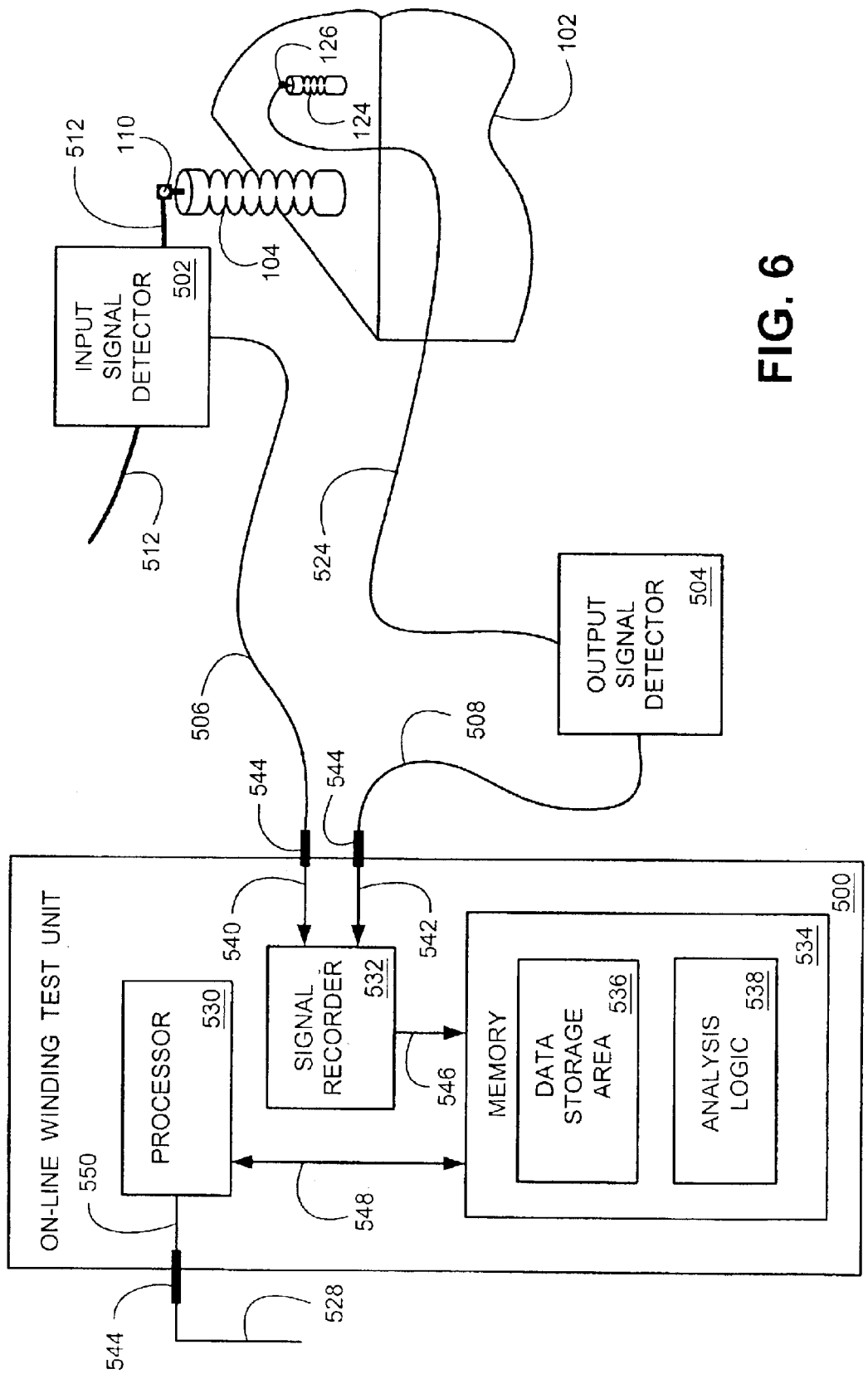
FIG. 6 is a block diagram illustrating selected components residing in the winding test unit configured to test the on-line transformer of FIG. 5.

FIG. 5 is a block diagram of an embodiment of a winding test unit 500 coupled to an on-line transformer 102. FIG. 6 is a block diagram illustrating selected components residing in the winding test unit 500 configured to test one high voltage winding of the on-line transformer 102 of FIG. 5.

FIG. 5 also illustrates an input signal detector 502 and an output signal detector 504 to transformer 102. On-line winding test unit 500 is coupled to the input signal detector 502 via connection 506 and is coupled to the output signal detector 504 via connection 508.

The transformer 102 illustrated in FIG. 5 has been described in detail above. However, as contrasted in FIG. 3 wherein the transformer 102 is off-line, transformer 102 in FIG. 5 is illustrated as being on-line. That is, transformer 102 is coupled to the energy delivery system and is energized. For convenience of illustration, a limited portion of the high voltage energy delivery system 510 that the high voltage bushing 104 is coupled to is illustrated in FIG. 5. A conductor 512 couples terminal 110 of the high voltage bushing 104 to the high voltage portion of the energy delivery system 510. Typically, conductor 512 is suspended from a structural member 514 with insulator 516. Insulator 516 provides electrical isolation from the conductor 512 and the structural member 514. Terminals 112 and 114 are similarly connected with conductors to provide connectivity back into the high voltage energy delivery system. However, such conductors are not shown for convenience of illustration. Likewise, conductors (not shown) coupled to terminals 122 couple the low voltage side of transformer 102 into the low voltage energy delivery system (not shown). A conductor 518 is coupled to terminal 126 of the neutral bushing 124 to provide connectivity back to a suitable grounding point (not shown).

For convenience of explaining the determination of an H(f) for one winding of interest, the winding test unit 500 is illustrated to test one high voltage winding of transformer 102. Accordingly, in another embodiment of the winding test unit 500, additional connections are provided to the terminals 112 and 114 to concurrently capture test data for the other windings so that H(f)'s for the other two high voltage windings of interest are determined. In another embodiment, additional connections (not shown) are provided on the winding test unit 500 to one or more of the low voltage terminals 122. Accordingly, H(f)'s for the coupled high and low voltage windings can be determined, and/or H(f)'s for a low voltage winding can be determined.

Input signal detector 502 is coupled to a convenient location on conductor 512. Alternatively, the input signal detector 502 may be coupled to terminal 110 or another suitable location on the high voltage bushing 104. Input signal detector 502 may be any suitable detecting device such that a pulse applied to terminal 110 is detected by the on-line winding test unit 500. Output signal detector 504 is similarly coupled to terminal 126 of the low voltage bushing 124, via connection 524. Alternatively, output signal detector 504 may be coupled directly to terminal 126 or onto conductor 518 such that the output pulse is detected by the on-line winding test unit 500. Input signal detector 502 and/or output signal detector 504, in one embodiment, are sensors that are already installed and in place on transformer 102, such as, but not limited to, a bushing capacitive tap, a current transformer (CT) or the like. Alternatively, input signal detector 502 and/or output signal detector 504 in another embodiment are commercially available high voltage dividers or clamp-on CTs. In yet another embodiment, input signal detector 502 and/or output signal detector 504 are specially designed and fabricated sensors. Any such well known sensor described above, or other types of suitable sensors, are acceptable devices for the detecting of the input pulses and the output pulses so long as the sensors are sufficiently sensitive to high frequency signals such that the pulses detected by the signals result in sufficiently accurate data over the frequencies of interest necessary for the determination of the characteristic signature of the monitored transformer winding.

When a pulse is generated out on the energy delivery system and applied to terminal 110, the pulse propagates through terminal 110, through the high voltage bushing 104, through the windings (not shown), and out to terminal 126 of the neutral bushing 124. Input signal detector 502 detects the generated pulse applied to terminal 110. Output signal detector 504 detects the output pulse on terminal 126. Signals corresponding to the detected input pulse and output pulse are provided to the on-line winding test unit 500 for storage in a memory and for later processing, as described below.

For convenience, on-line winding test unit 500 is illustrated as being coupled to printer 526 via connection 528. Thus, upon conclusion of the analysis of the input and output pulses, on-line winding test unit 500 outputs one or more suitably formatted reports to printer 526 for printing. One skilled in the art will appreciate that the on-line winding test unit 500 is configured to output any of a variety of suitable output signal formats. For example, another embodiment of on-line winding test unit 500 is configured to provide output to a display screen such as a cathode ray tube (CRT) or other suitable display screen. Another embodiment of on-line winding test unit 500 is configured to provide an output signal that is stored on a suitable storage media. Examples of suitable storage media include, but are not limited to, any one or combination of volatile memory elements (e.g., random access memory (RAM, such as DRAM, SRAM, etc.)) and nonvolatile memory elements (e.g., ROM, hard drive, tape, CDROM, etc.). Moreover, suitable storage media may incorporate electronic, magnetic, optical, and/or other types of storage media. Note that the suitable storage media can have a distributed architecture, where various components are situated remote from one another, but can be accessed by the on-line winding test unit 500, either directly or indirectly. Such an embodiment of the on-line winding test unit 500 would be particularly suitable for providing documentation of analysis results, for storing data and/or analysis results in a centralized location for future use, and/or for analyzing data in additional detail.

FIG. 6 is a block diagram illustrating selected components residing in the online winding test unit 500. On-line winding test unit 500 includes at least a processor 530, a signal recorder 532 and a memory 534. Memory 534 includes a data storage area 536 and the analysis logic 538.

Incoming pulses applied to terminal 110 are detected by the input signal detector 502. A signal corresponding to the detected input pulse is provided to the signal recorder 532, via connection 540 which is coupled to connection 506. Similarly, the output pulse is detected by the output signal detector 504 and a signal corresponding to the detected output pulse is provided to signal recorder 532, via connection 542 which is coupled to connection 508. In one embodiment, connection 506 is coupled to connection 540, and connection 508 is coupled to connection 542, with a commonly available plug-in connector 544. Examples of plug-in connector 544 include, but are not limited to, a commercially available banana plug, coaxial cable connector, alligator clip, lug, screw or the like. Alternatively, connections 506 and 508 are fixably attached to connections 540 and 542, respectively, thereby providing a secure coupling.

Signal recorder 532 is coupled to memory 534 via connection 546. The received signals corresponding to the input and output pulses detected by the input signal detector 502 and the output signal detector 504, respectively, are processed into an appropriate data format for storage into the data storage area 536 in a manner described below.

Processor 530 is coupled to memory 534 via connection 548. Processor 530, as described hereinafter, executes the analysis logic 538 residing in memory 534 so that the data corresponding to the detected input and output pulses, described above and residing in the data storage area 536, are processed into frequency bins in a manner described below. Processor output connection 550 is coupled to connection 528 so that a suitable output report may be provided. For convenience of illustration, connection 550 is coupled to connection 528 with a plug-in connector 544, described above. However, alternative embodiments may employ other types of suitable connectors, or connection 550 may be fixably attached to connection 528, without departing substantially from the operation and functionality of the present invention.

In an alternative embodiment, processor 530 is coupled to an optional viewing screen (not shown). The optional viewing screen is used by the user to view selected detected input and output pulses, and/or the output reports generated by processor 530. The viewing screen may be any suitable device for displaying an output signal. For example, but not limited to, a viewing screen may be a cathode ray tube (CRT), a flat panel screen, a light emitting diode (LED) screen, liquid crystal display (LCD), or any other well known viewing device. An on-line winding test unit 500 employing any suitable viewing screen embodiment is intended to be within the scope of this disclosure and protected by the accompanying claims.

Summarizing, when on-line winding test unit 500 and output signal detector 504 are coupled to transformer 102 as described above, a pulse originating on the energy delivery system, detected by the input signal detector 502, propagates through the transformer windings (not shown) and an output pulse is detected by output signal detector 504. A signal corresponding to the detected input pulse and a signal corresponding to the detected output pulse are provided to signal recorder 532. Signal recorder 532 receives the signals and provides data corresponding to the signals to memory 534 for storage in the data storage area 536 on memory 534.

As the signal recorder 532 is providing data corresponding to the detected input pulse and the detected output pulse into the data storage area 536, processor 530 executes analysis logic 538 to further process the stored input pulse and output pulse data. Ultimately, a characteristic signature of the monitored transformer winding is calculated over a frequency range of interest.

An alternative embodiment of the on-line winding test unit 500 is configured such that the signal recorder 532 provides data corresponding to the detected input pulse and the detected output pulse directly to processor 530. Processor 530 processes the data received from the signal recorder 532 into the appropriate frequency bins, and then stores the data points for each of the frequency bins into the data storage area 536. Such an embodiment may be particularly advantageous when the overall memory storage region of memory 534 is limited in capacity.

F. On-Line Testing to Determine H(f) Data

As described above, a voltage pulse (corresponding to an abrupt change in voltage and/or current) is generated out on the energy delivery system. The pulse propagates through the energy delivery system to the transformer 102 and is subsequently applied to the monitored terminal 110 of transformer 102. The incoming pulse is detected by the input signal detector 502 and an output pulse is detected by the output signal detector 504. Data corresponding to the detected input and output pulses are then simultaneously digitized and processed by FFT to be allocated to a plurality of predefined frequency bins. Thus, for each of the detected input pulses and output pulses, a frequency domain data point is stored in each one of the frequency bins. Next, the analysis process computes the auto-spectral densities and a cross-spectral density of each of the data points for each frequency bin, as described below.

For each frequency bin, the auto-spectra $G_{xx}(f)$ is calculated by computing the complex conjugate (*) of the Fast Fourier Transform (FFT) of the input pulse, x(t), and then multiplying by the FFT of the same input pulse as shown in equation 7 below:

$$G_{xx}(f)=[X(f)^*]X(f) \qquad \text{Eq. 7}$$

Where X(f) is the FFT of the input signal x(t)

Then, for each frequency bin, the auto-spectra $G_{yy}(f)$ is calculated by computing the complex conjugate (*) of the FFT of the output pulse, y(t), and then multiplying by the FFT of the same output pulse, as shown in equation 8 below:

$$G_{yy}(f)=[Y(f)^*]Y(f) \qquad \text{Eq. 8}$$

Where Y(f) is the FFT of the output signal y(t)

Next, the cross-spectra $G_{xy}(f)$ from input to output is calculated by computing the complex conjugate (*) of the FFT of the input pulse x(t) with the FFT of the output pulse y(t) as shown in equation 9 below:

$$G_{xy}(f)=[X(f)^*]Y(f) \qquad \text{Eq. 9}$$

Where X(f) is the FFT of the input signal x(t)

And Y(f) is the FFT of the output signal y(t)

For each frequency bin, H(f), is calculated in one embodiment by dividing approximately 10 averages of the cross-spectra $G_{xy}(f)$ by the corresponding approximately 10 averages of the auto-spectra $G_{xx}(f)$ for each one of the frequency bins in accordance with equation 10 below:

$$H(f)=G_{xy}(f)/G_{xx}(f) \qquad \text{Eq. 10}$$

Other embodiments may calculate H(f) using any suitable number of $G_{xy}(f)$ and $G_{xx}(f)$ data.

Next, a determination must be made whether or not each one of the calculated characteristic signature portions of H(f) is valid or invalid. That is, for each data point associated with each data bin, the characteristic signature portion is evaluated to determine if the data point provides useable information. If the data point is determined to be valid, the data point is saved for further analysis. If the data point is determined to be invalid, the data point is rejected and/or discarded. Thus, a database having valid H(f) data points is eventually accumulated after the detection of a suitable number of pulses such that a characteristic signature for the monitored transformer winding may be determined, in a manner described hereinafter.

To determine whether a data pair in a frequency bin is valid or invalid, the coherence of the data point and/or the random error of the data point is considered. The coherence for each data point is calculated according to the coherence function $\gamma^2_{xy}(f)$, as shown in equation 11 below:

$$\gamma^2_{xy}(f)=|G_{xy}(f)|^2/G_{xx}(f)G_{yy}(f) \qquad \text{Eq. 11}$$

The coherence function $\gamma^2_{xy}(f)$ is a real valued function having a magnitude ranging from 0 to 1. A value of 1 would indicate a perfect linear relationship from the input pulse portion to the detected output pulse portion in the frequency bin. A value of 0 would indicate a complete non-linear relationship between the input pulse portion and the detected output pulse portion in the frequency bin. In addition, the coherence function is sensitive to improper digitizing (alaising) of the input and output pulses and will also respond to high input noise levels. Problems in all these areas will lower the calculated coherence value on a point by point basis of the characteristic signature H(f). The coherence function $\gamma^2_{xy}(f)$ is very sensitive to relatively small errors in the magnitude (or phase) estimate for the characteristic signature, H(f). In one embodiment, a data point having a coherence of 0.4 or greater is considered as a valid data point. Data points having a coherence of less than 0.4 are considered invalid and are rejected.

Additionally, a further determination of whether data in a frequency bin or any number of bins is valid or invalid is made by computing the random error function for the H(f). The random error, $E_r|H(f)|$, provides a statistical analysis of the data and defines a 95% confidence interval for the H(f)

data that is graphed over a frequency range of interest. The random error for the frequency bin(s) of the present test can be compared to the random error for the same frequency bin(s) on a past test for the same test configuration. If the random error increases significantly for the 95% confidence interval during a follow-up test, then there is a problem with the test set-up for this particular test. For example, there could be problems such as loss of input pulse, open leads, or open connections, or wrong connections etc. with the test set. A real change in H(f) due to winding displacement will not significantly change the random error calculation for a given test configuration.

The 95% confidence interval is calculated according to the random error function $E_r|H(f)|$, as shown in equation 12 below, from a previously collected data base of known valid data points:

$$E_r|H(f)|=[1-\gamma^2_{xy}(f)]^{1/2}/|\gamma_{xy}(f)|(2n_d)^{1/2}$$    Eq. 12

The term nd equals the number of spectral density averages used in the H(f) calculation Over a period of time, a sufficient number of pulses are generated out on the energy delivery system. These pulses propagate through the energy delivery system to transformer 102 (FIGS. 5 and 6). Many of the pulses will have sufficient energy in at least some portions of the frequency range of the characteristic signature to generate a plurality of valid data points for H(f). After a sufficient number of input pulses have propagated through the monitored winding such that a pre-determined number of frequency bins contain a suitable amount of usable data for analysis, the processor 530 (FIG. 6), in one embodiment, automatically calculates a characteristic signature of the monitored winding. The H(f) data points for a selected number of frequency bins are combined to create a characteristic signature over the frequency range of interest. Many of the "empty" or unusable frequency bins can be omitted from the H(f) construction and still provide a very good H(f) representation. For example, most winding deformation and/or displacement alters H(f) over many adjacent frequency bins, so omitting some frequency bins will not significantly compromise the H(f) construction. In summary, the characteristic signature is computed by aggregating the H(f) from the usable and sufficient frequency bins for the H(f) bandwidth of interest.

H(f) is calculated for data points collected over some known period of time. The period of time that the data points were collected over must be sufficiently long enough so that a suitable number of data points for each frequency bin are collected. However, the period of time must not be so long as to compromise the characteristic signature due to long term changes such as extreme ambient seasonal temperatures, transformer oil processing, or normal aging etc. That is, the period of time must be short enough that there has been little or no probability of substantial winding deformation and/or displacement. For convenience, this time period is referred to herein as a predefined testing time period. Furthermore, when H(f) and the associated coherence data is saved, other relevant data is also saved such that the H(f) and the associated coherence data is identifiable. For example, but not limited to, the starting and ending dates and/or times of the data collection period may be identified. Transformer serial number, transformer location and/or winding identification may be included. Other information of interest may also be included.

G. Multiphase Testing Embodiment

Figure 7:
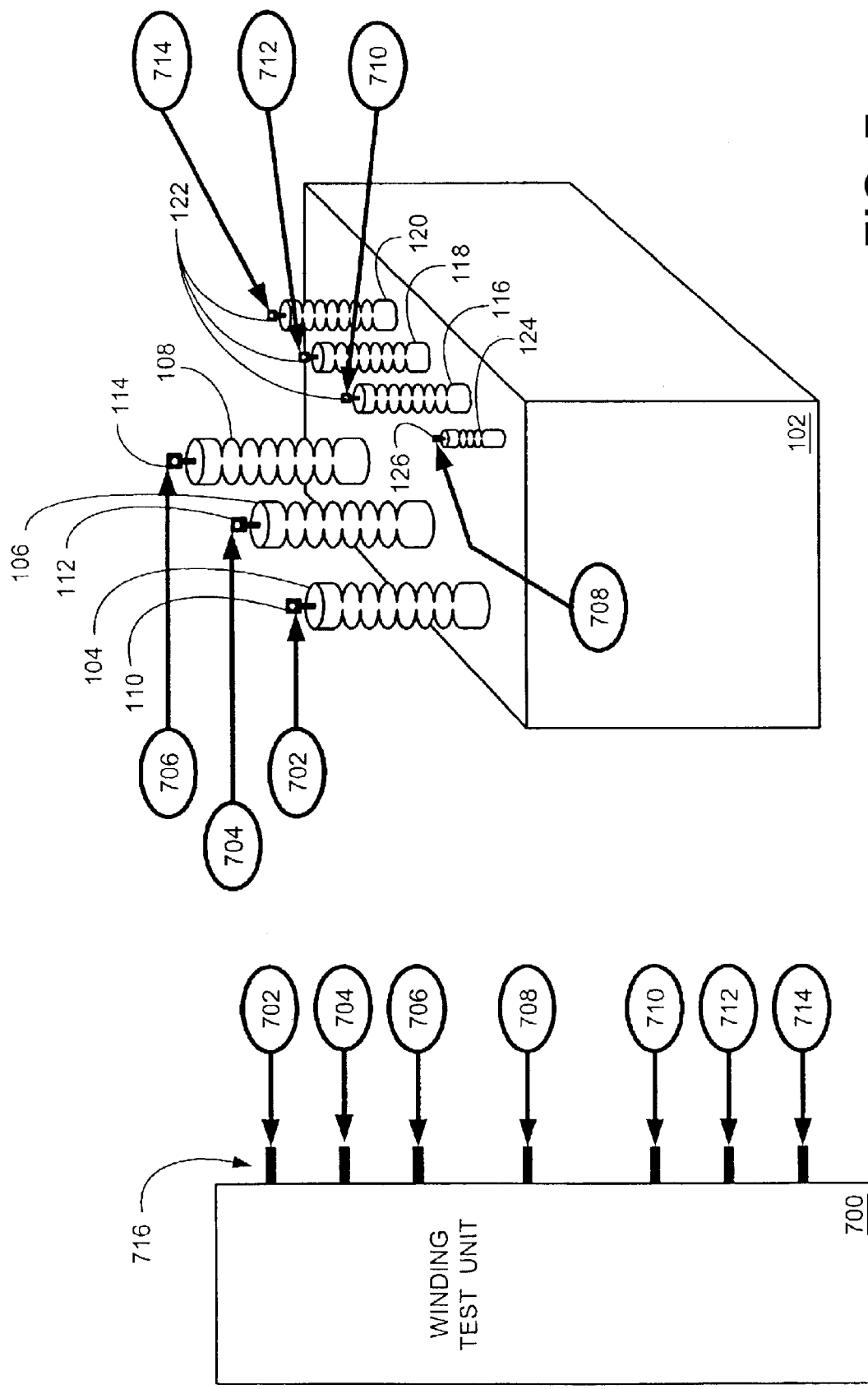
FIG. 7 is a block diagram of an embodiment of a winding test unit coupled to a plurality of terminals of a transformer.

FIG. 7 is a block diagram of an embodiment of a winding test unit 700 coupled to a plurality of terminals of transformer 102. The winding test unit includes a plurality of connection means so that a plurality H(f)'s for a plurality of windings can be determined and compared in accordance with the present invention.

A connection 702 is configured to couple the winding test unit 700 with high voltage bushing 104 terminal 110. Connections 704 and 706 are similarly configured to couple the winding test unit 700 with terminals 112 and 114. A connection 708 is configured to couple the winding test unit 700 with the neutral voltage bushing 124 terminal 126.

As described above for the winding test units 300 and 500, the connections 702 and 708 provide for testing and/or accumulating test data for the winding between terminals 110 and 126. Such testing and/or accumulation of data may be done when transformer 107 is off-line or on-line, depending upon the embodiment. Similarly, the connections 704 and 708, and the connections 706 and 708, provide for testing and/or accumulating test data for the windings between terminals 112 and 126, and between terminals 114 and 126, respectively. In accordance with the present invention, H(f)'s can be determined for the three high voltage side windings without having to reconfigure connections to test and/or accumulate test data for each winding separately.

Connections 710, 712 and 714 are configured to couple the winding test unit 700 with terminals 122 associated with low voltage bushings 116, 118 and 120, respectively. Accordingly, the connections 710, 712 and 714 provide for testing and/or accumulating test data for the windings between terminals 122 and 126. In accordance with the present invention, H(f)'s can be determined for the three low voltage side windings without having to reconfigure connections and/or accumulate test data for each winding separately. The H(f)'s can then be compared in accordance with the present invention as described above such that significant winding deformation, displacement, and/or insulation degradation can be detected in the low voltage windings if significant asymmetries in the H(f)'s are identified.

If desired, test data for a plurality of electromagnetically and/or capacitively coupled windings may be recorded such that an H(f) associated with the plurality of coupled windings are determined. For example, the winding associated with terminal 110 may be associated, by phase, with the winding associated with terminal 122 of the low voltage bushing 116. By detecting signals at terminal 110 and terminal 122 of the low voltage bushing 116, an H(f) for the two coupled windings can be determined. Similarly, H(f)'s for the terminal 112 and terminal 122 of the low voltage bushing 118, and for the terminal 114 and terminal 122 of the low voltage bushing 118, can be determined. These H(f)'s can be determined without having to reconfigure connections and/or accumulate test data for each of the coupled winding pairs separately. The H(f)'s can then be compared in accordance with the present invention as described above such that significant winding deformation, displacement, and/or insulation degradation can be detected in the magnetically and/or capacitively coupled winding pairs if significant asymmetries in the H(f)'s are identified.

The above-described connections, in one embodiment, are configured to couple to the winding test unit 700 using plug-in attachments 716. In another embodiment, the connections are fixably attached to the winding test unit 700.

It should be emphasized that the above-described "embodiments" of the winding test unit, particularly, any "preferred" embodiments, are merely possible examples of implementations, merely set forth for a clear understanding of the principles of the winding test unit. Many variations and modifications may be made to the above-described Therefore, the following is claimed:

1. A system for testing a plurality of windings, comprising:

an input signal sensor configured to detect a plurality of input signals entering a plurality of corresponding windings;

an output signal sensor configured to detect a plurality of output signals, each one of the output signals corresponding to one of the input signals after the corresponding input signal has propagated through one of the plurality of windings; and a processor communicatively coupled to the input signal sensor and the output signal sensor, the processor programmed to compute a plurality of unique characteristic signatures [H(f)'s] from the plurality of input signals and the corresponding output signal associated with each of the plurality of windings, to compute a unique plurality of differential H(f)'s from a plurality of H(f) pairs selected from the plurality of H(f)'s, and to compare the plurality of differential H(f)'s to identify at least one asymmetry.

2. The system of claim 1, wherein the processor is further configured to:

compute for each one of the plurality of input signals an auto-spectral density (Gxx) based upon a frequency response X(f) of each input signal;

compute a cross-spectral density (Gxy) based upon the frequency response X(f) of each input signal and a frequency response Y(f) of the associated output signal; and compute the plurality of H(f)'s for each winding based upon Gxy and Gxx for associated pairs of the plurality of input and the plurality of output signals.

3. The system of claim 1, further comprising:

a signal generator, the signal generator configured to generate the plurality of input signals that are applied to each of the plurality of windings;

a means for adjusting the input signals and coupled to the signal generator, the means for adjusting configured to adjust at lease one parameter of a generated input signal; and an input control means coupled to the means for adjusting so that a user may selectively adjust the parameter.

4. A method for analyzing a plurality of windings, the method comprising the steps of:

determining a plurality of characteristic signatures [H(f)'s] for each of the plurality of windings;

determining a plurality of differential characteristic signatures [H(f)'s] from a plurality of H(f) pairs selected from the plurality of H(f)'s;

comparing the differential H(f)'s; and identifying at least one asymmetry between the differential H(f)'s.

5. The method of claim 4, wherein the step of comparing further comprises the step of comparing the symmetry of the H(f)'s, and wherein the step of identifying further comprises the step of determining a magnitude of the at least one asymmetry between the differential H(f)'s.

6. The method of claim 4, further comprising, for each one of the plurality of windings, the steps of:

applying an input signal;

detecting an output signal corresponding to the input signal, the output signal resulting from a propagation of the input signal through the winding; and computing the H(f) based upon the input signal and the output signal.

7. The method of claim 6, further comprising the step of repeating the steps of applying, detecting and computing a plurality of times for each one of the plurality of windings.

8. The method of claim 4, further comprising, for each one of the plurality of windings, the steps of:

detecting an input signal;

detecting an output signal corresponding to the input signal, the output signal resulting from a propagation of the input signal through the winding; and computing the H(f) based upon the input signal and the output signal.

9. The method of claim 4, further comprising, for each one of the plurality of windings, the steps of:

determining an input signal frequency response [X(f)] for an input signal over a frequency range of interest, the frequency range of interest being divided into a plurality of frequency bins each corresponding to a predefined portion of the frequency range of interest, such that the X(f) comprises a plurality of X(f) data values each uniquely assigned to one of the corresponding frequency bins;

determining an output signal frequency response [Y(f)] for an output signal, such that the Y(f) comprises a plurality of Y(f) data values each uniquely assigned to one of the corresponding frequency bins;

computing an input signal auto-spectral density ($G_{xx}$) for the input signal frequency response X(f), such that the $G_{xx}$ comprises a plurality of $G_{xx}$ data values each uniquely assigned to one of the corresponding frequency bins;

computing a cross-spectral density ($G_{xy}$) from the input signal frequency response X(f) and the output signal frequency response Y(f), such that the $G_{xy}$ comprises a plurality of $G_{xy}$ data values each uniquely assigned to one of the corresponding frequency bins;

repeating a plurality of times the steps of: determining X(f), determining Y(f), computing $G_{xx}$, and computing $G_{xy}$; and computing an average characteristic signature [H(f)] for the winding based upon an average of $G_{xy}$ and $G_{xx}$, such that the average H(f) comprises a plurality of H(f) data values each uniquely assigned to one of the corresponding frequency bins.

10. The method of claim 9, further comprising the steps of:

defining a plurality of pairs of H(f)'s for the plurality of windings selected from the average H(f)'s;

for each of the pairs of the H(f)'s, determining a differential H(f) data value for each of the frequency bins, the differential H(f) data value corresponding to the difference between the H(f) data values associated with each one of the plurality of pairs of H(f)'s at each of the frequency bins; and determining the plurality of differential H(f)'s, each of the differential characteristic signatures comprised of the determined differential H(f) data values for each of the frequency bins.

11. The method of claim 10, further comprising the step of screening the determined plurality of differential H(f)'s to identify at least a portion of the differential H(f)'s greater than a predefined threshold.

12. The method of claim 10, further comprising the step of normalizing each of the differential H(f)'s.

13. The method of claim 12, wherein the step of normalizing further includes the step of dividing each of the determined differential H(f) data values for each of the frequency bins by the corresponding differential H(f) data value from a selected one of the differential H(f)'s.

14. The method of claim 12, wherein the step of normalizing further includes the steps of:

determining for each of the plurality of frequency bins a plurality of average differential H(f) data values, the average differential H(f) data values determined by computing the average of the differential H(f) data values at corresponding frequency bins; and dividing each of the determined differential H(f) data value for each of the frequency bins by the corresponding average differential H(f) data value.

15. The method of claim 12, wherein the step of normalizing further includes the steps of:

adding H(f) data values for the H(f) pairs associated with one of the differential H(f)s;

dividing the added H(f) data values by a total number of frequency bins in the H(f) pairs to determine an average data value; and dividing each of the determined differential H(f) data values for each of the frequency bins by the average data value.

16. The method of claim 12, further comprising the steps of:

computing an auto-spectral density ($G_{yy}$) based upon the frequency response Y(f), such that the $G_{yy}$ comprises a plurality of $G_{yy}$ data values each uniquely assigned to one of the corresponding frequency bins;

computing a coherence function [$\gamma^2_{xy}$], such that the $\gamma^2_{xy}$ comprises a plurality of $\gamma^2_{xy}$ data values each uniquely assigned to one of the corresponding frequency bins;

computing an error function ($E_r$), based upon the $\gamma^2_{xy}$ such that the $E_r$ comprises a plurality of $E_r$ data values each uniquely assigned to one of the corresponding frequency bins; and weighting the normalized differential H(f)'s by a number corresponding to the computed $E_r$ to determine a weighted normalized differential H(f)'s.

17. The method of claim 16, wherein the step of weighting further comprising the steps of:

multiplying each of the determined normalized differential H(f) data values for each of the frequency bins by (1−Er|H(f)| data value)$^2$ for a first H(f) of the corresponding H(f) pair;

multiplying each of the determined normalized differential H(f) data values for each of the frequency bins by (1−Er|H(f)| data value)$^2$ for a second H(f) of the corresponding H(f) pair;

determining an average Er|H(f)| data value; and dividing each of the determined normalized differential H(f) data value differences for each of the frequency bins by (1−average Er|H(f)| data value)$^2$.

18. The method of claim 16, wherein the step of weighting further comprising the steps of:

multiplying each of the determined normalized differential H(f) data values for each of the frequency bins by (1−Er|H(f)| data value)$^2$ for a first H(f) of the corresponding H(f) pair;

multiplying each of the determined normalized differential H(f) data values for each of the frequency bins by (1−Er|H(f)| data value)$^2$ for a second H(f) of the corresponding H(f) pair;

averaging the multiplied determined normalized differential H(f) data values to determine a number;

multiplying the number by a constant to determine a resultant number;

determining an average Er|H(f)| data value; and dividing the resultant number by (1−average Er|H(f)| data value)$^2$.

19. The method of claim 16, further comprising the step of determining a weighted normalized difference (WND) value from the weighted normalized differential H(f)'s.

20. The method of claim 19, for three of the plurality of windings such that there is a first WND value associated with a first winding pair, a second WND value associated with a second winding pair and a third WND value associated with a third winding pair, for each of the frequency bins, wherein the step of determining the WND value further comprises the steps of:

averaging the first WND value and the second WND value to determine an average value;

dividing the average value by the third WND value to determine an aggregate WND value;

subtracting one from the aggregate WND value to determine a final WND value; and converting the final WND value to a percentage.

21. The method of claim 20, wherein the first WND value and the second WND value each have a magnitude that is greater than a magnitude of the third WND value.

22. The method of claim 20, wherein the first WND value corresponds to a first differential H(f) associated with the first winding pair, the second WND value corresponds to a second differential H(f) associated with the second winding pair, and the third WND value corresponds to a third differential H(f) associated with the third winding pair.

23. The method of claim 19, further comprising the steps of:

comparing the WND value with a first predefined threshold;

communicating a first message when the WND value is less than the first predefined threshold; and communicating a second message when the WND value is at least equal to the first predefined threshold.

24. The method of claim 23, further comprising the steps of:

communicating the first message using a first color to indicate that the condition of the plurality of windings are acceptable; and communicating the second message using a second color to indicate that the condition of the plurality of windings are not acceptable.

25. The method of claim 4, wherein the steps of determining, comparing and identifying for each one of the plurality of windings is performed within a predefined testing time period.

26. A system for testing a plurality of windings, comprising:

means for determining a plurality of characteristic signatures [H(f)'s] for each of the plurality of windings;

means for determining a plurality of differential characteristic signatures [H(f)'s] from a plurality of H(f) pairs selected from the plurality of H(f)'s;

means for comparing the differential H(f)'s; and means for identifying at least one significant asymmetry between the differential H(f)'s.

27. The system of claim 26, wherein the means for comparing further comprises means for comparing a symmetry of the H(f)'s, and wherein the means for identifying further comprises means for determining a magnitude of the at least one significant asymmetry between the differential H(f)'s.

28. A computer-readable medium having a program for testing a plurality of windings, the program comprising logic configured to perform the steps of:

determining a plurality of characteristic signatures [H(f)'s] for each of the plurality of windings;

determining a plurality of differential characteristic signatures [H(f)'s] from a plurality of H(f) pairs selected from the plurality of H(f)'s;

comparing the differential H(f)'s; and identifying at least one significant asymmetry between the differential H(f)'s.

29. The computer-readable medium of claim 28, wherein the logic for comparing further comprises logic for comparing the symmetry of the H(f)'s, and wherein the logic for identifying further comprises logic for determining a magnitude of the at least one significant asymmetry between the differential H(f)'s.

* * * * *